United States Patent [19]

Komori et al.

[11] Patent Number: 5,079,603
[45] Date of Patent: Jan. 7, 1992

[54] SEMICONDUCTOR MEMORY DEVICE

[75] Inventors: Kazuhiro Komori, Kodaira; Satoshi Meguro; Takaaki Hagiwara, both of Hinode; Hitoshi Kume; Toshihisa Tsukada, both of Musashino; Hideaki Yamamoto, Tokorozawa, all of Japan

[73] Assignee: Hitachi, Ltd., Tokyo, Japan

[21] Appl. No.: 517,386

[22] Filed: Apr. 30, 1990

Related U.S. Application Data

[63] Continuation of Ser. No. 440,475, Nov. 21, 1989, abandoned, which is a continuation of Ser. No. 310,014, Feb. 13, 1989, abandoned, which is a continuation of Ser. No. 53,730, May 26, 1987.

Foreign Application Priority Data

May 26, 1986 [JP] Japan .................. 61-119215

[51] Int. Cl.$^5$ .......... H01L 29/78; H01L 27/02; H01L 49/02
[52] U.S. Cl. .................. 357/23.5; 357/23.4; 357/23.8; 357/6; 357/41; 357/92
[58] Field of Search .......... 357/23.5, 23.4, 23.8, 357/6, 41, 92

[56] References Cited

U.S. PATENT DOCUMENTS

| | | | |
|---|---|---|---|
| 3,868,187 | 2/1975 | Masuoko | 357/23.5 |
| 4,142,926 | 3/1979 | Morgan | 357/23.5 |
| 4,258,378 | 3/1981 | Wall | 357/23.5 |
| 4,290,077 | 9/1981 | Ronen | 357/23.4 |
| 4,376,947 | 3/1983 | Chin et al. | 357/23.5 |
| 4,573,144 | 2/1986 | Countryman, Jr. | 357/23.5 |
| 4,630,085 | 12/1986 | Koyama | 357/23.5 |
| 4,642,881 | 2/1987 | Matsukawa et al. | 357/23.5 |
| 4,665,418 | 5/1987 | Mizutani | 357/23.5 |
| 4,698,787 | 10/1987 | Mukherjee et al. | 357/23.5 |

FOREIGN PATENT DOCUMENTS

| | | | |
|---|---|---|---|
| 54-8988 | 1/1979 | Japan | 357/23.5 |
| 54-156483 | 12/1979 | Japan | 357/23.5 |
| 59-110158 | 6/1984 | Japan | 357/23.5 |

*Primary Examiner*—Andrew J. James
*Assistant Examiner*—Ngan Van Ngo
*Attorney, Agent, or Firm*—Antonelli, Terry, Stout & Kraus

[57] ABSTRACT

This invention discloses an EEPROM which increases an erasing voltage $V_{pp}$ to be applied during a data write cycle by increasing an avalanche breakdown voltage between a source region and a semiconductor substrate in the memory cell transistor in order to improve the erasing efficiency, and employs a structure which strengthens the electric field at the edge of a drain region in order to let hot carriers be easily generated and to thereby improve writing efficiency.

52 Claims, 25 Drawing Sheets

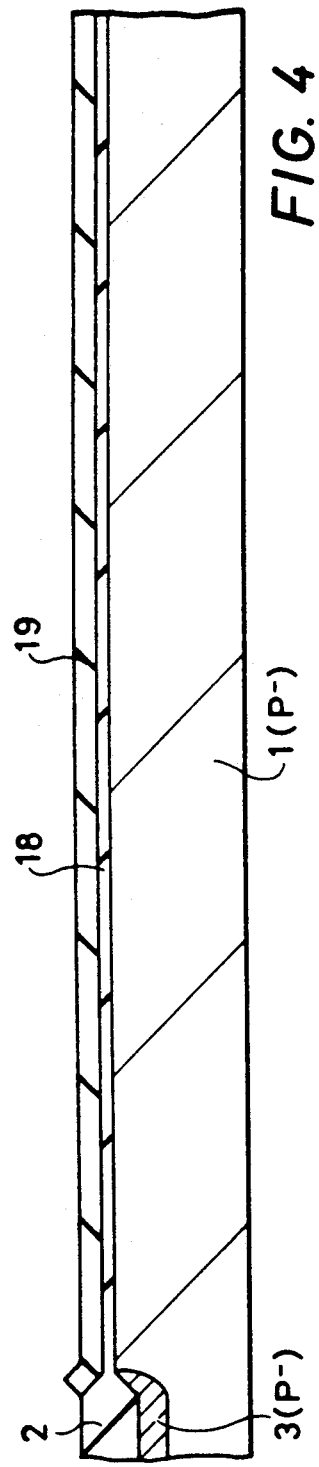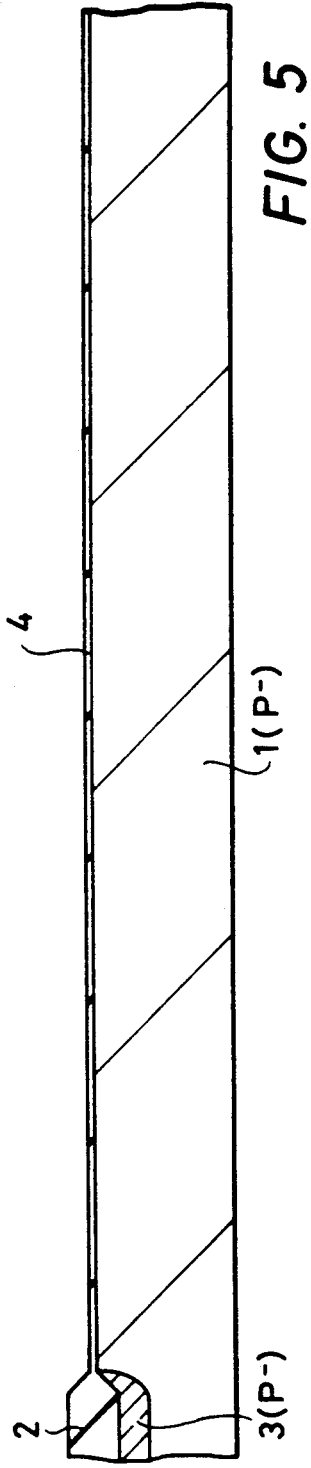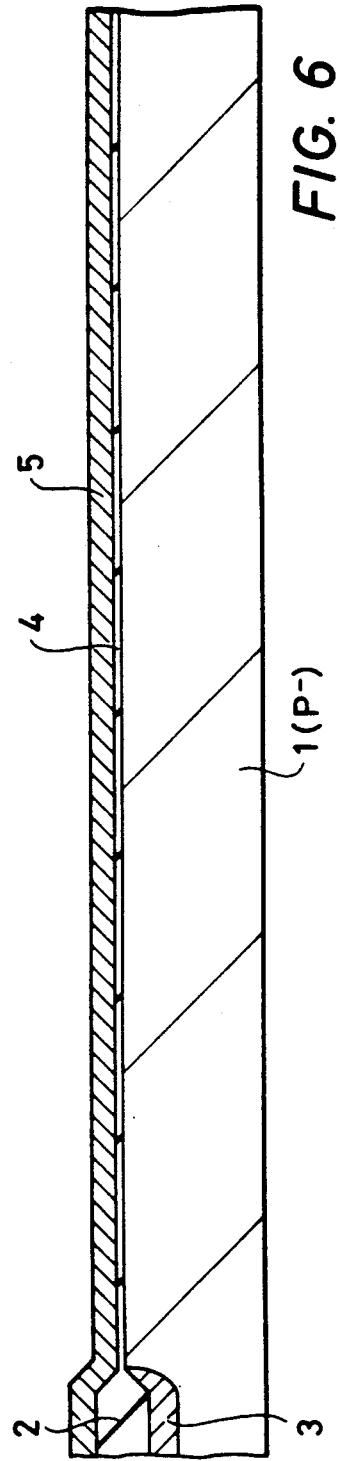

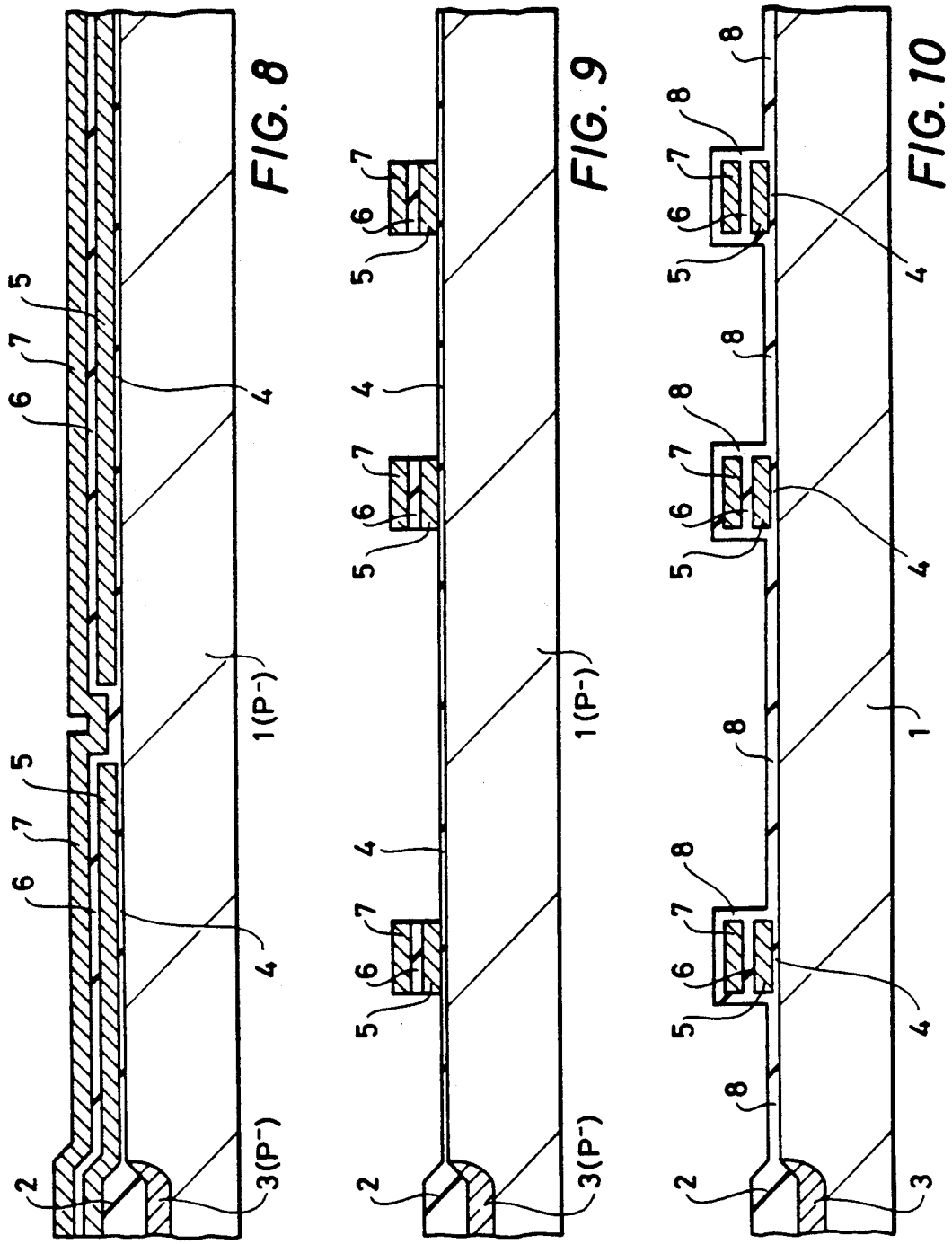

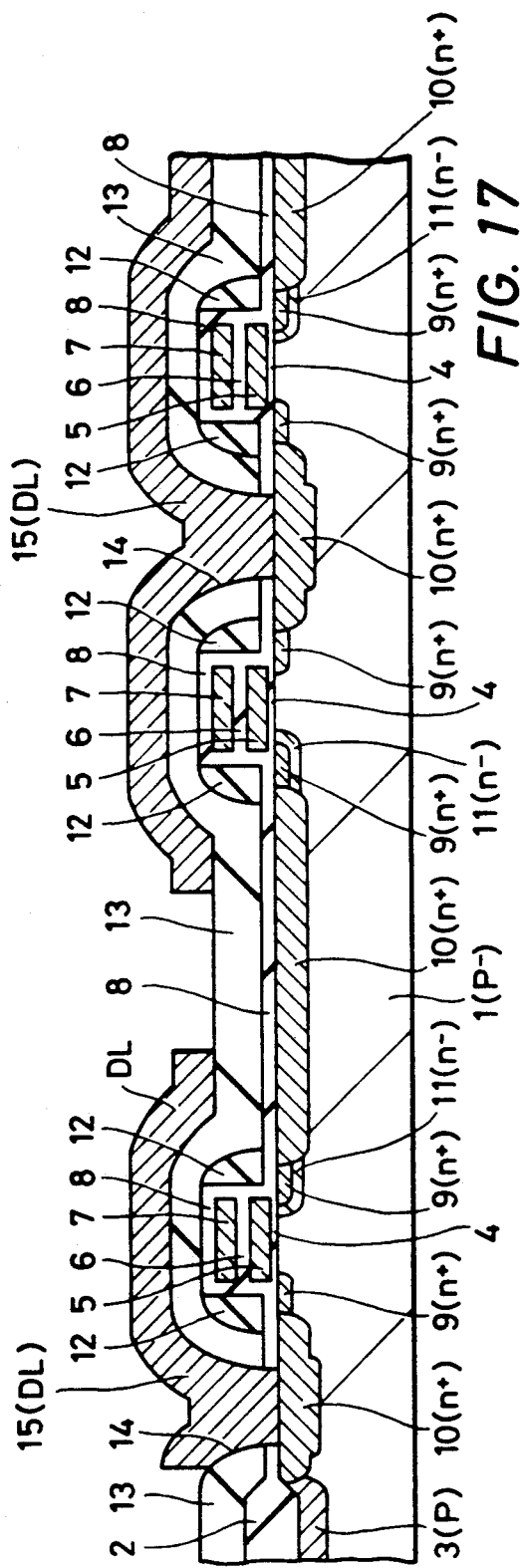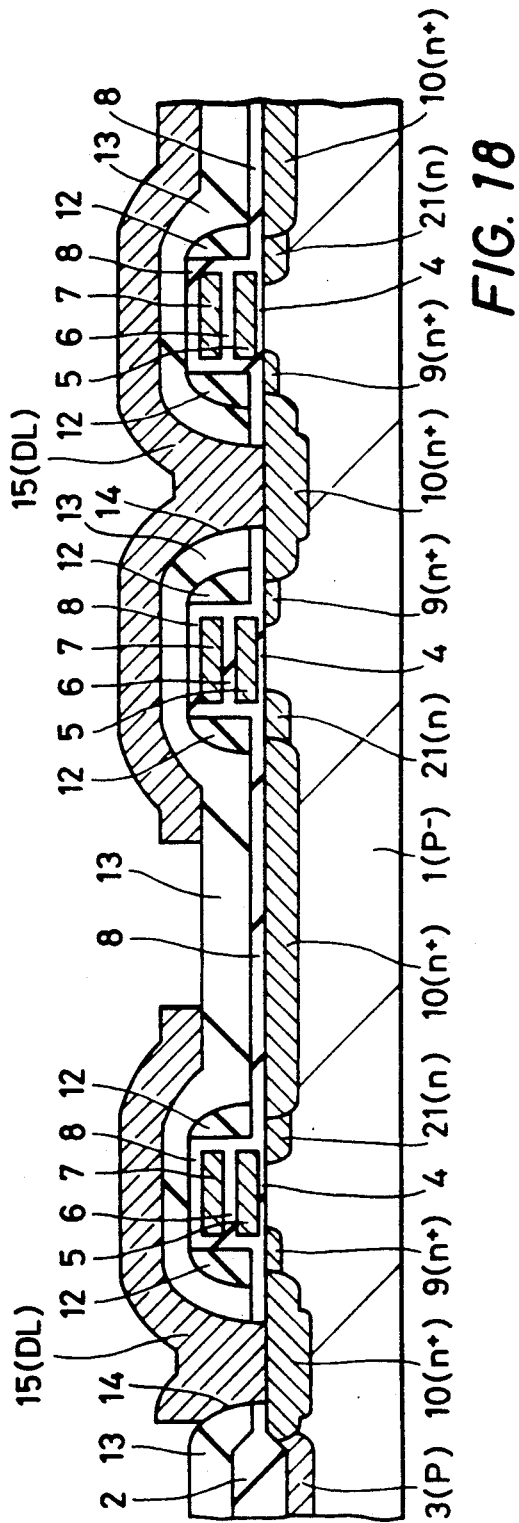

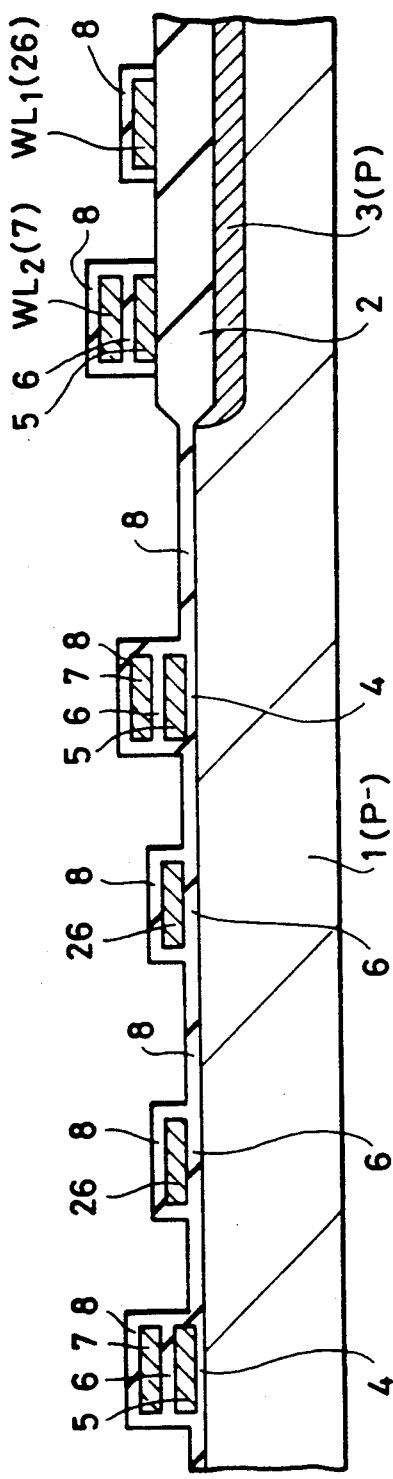
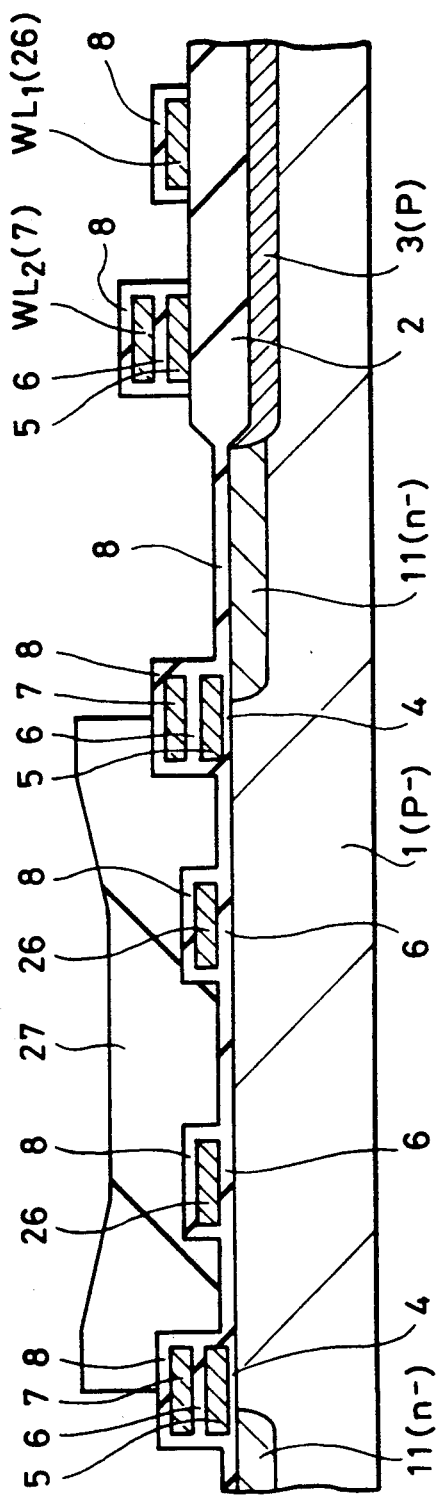

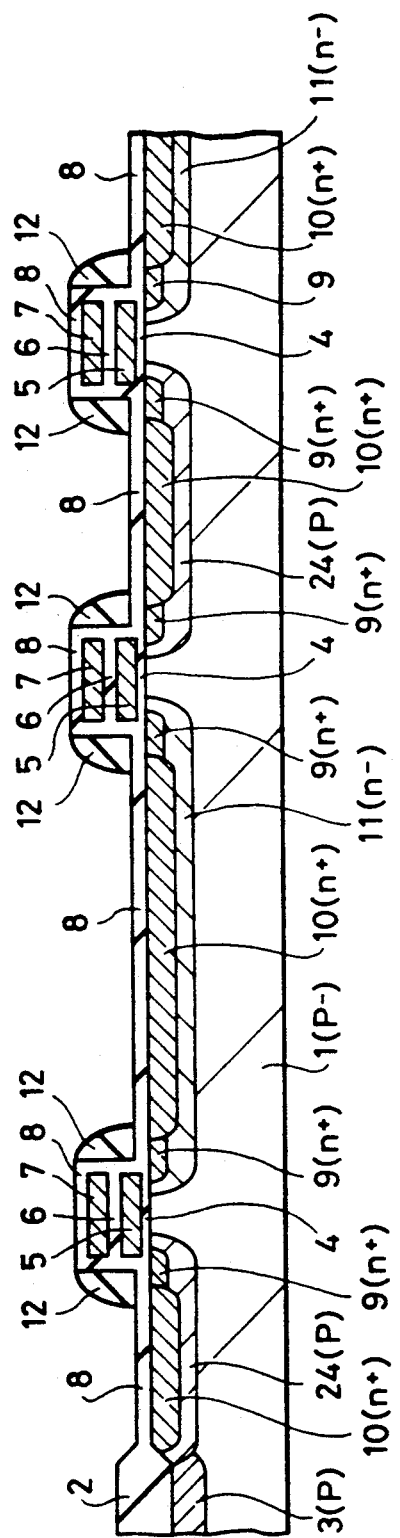
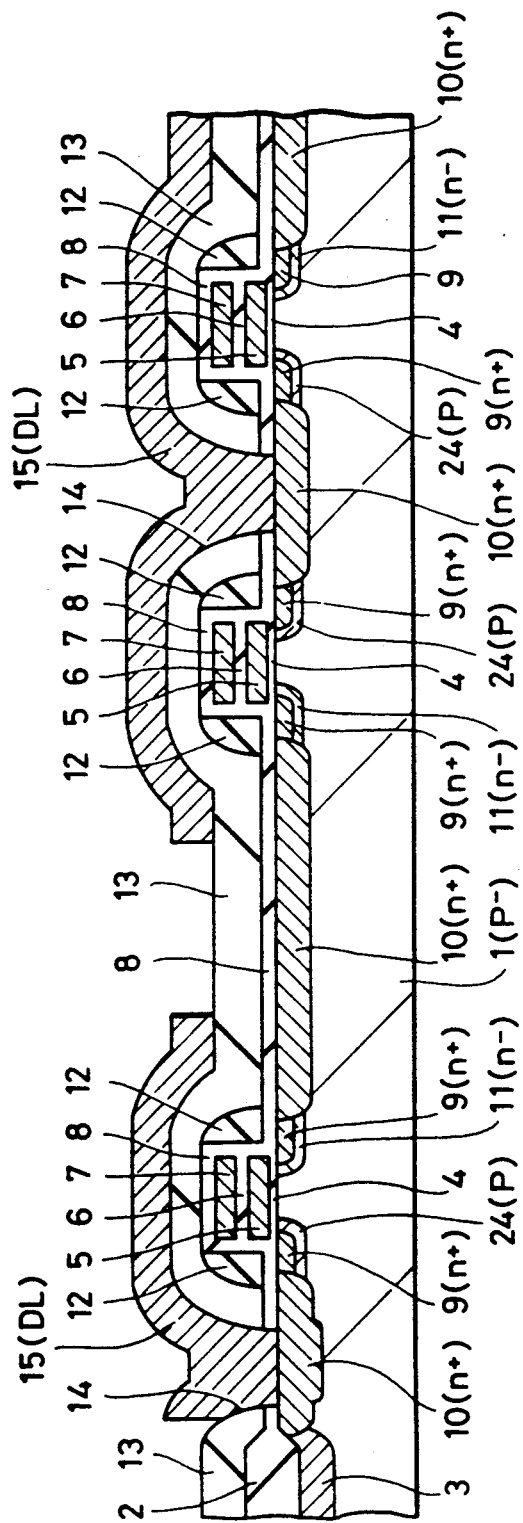

SEMICONDUCTOR MEMORY DEVICE

This application is a Continuation of application Ser. No. 07/440,475, filed Nov. 21, 1989, which is a continuation of application Ser. No. 07/310,014, filed Feb. 13, 1989, which is a continuation application of Ser. No. 07/053,730, filed May 26, 1987, now abandoned.

BACKGROUND OF THE INVENTION

This invention relates generally to a semiconductor memory device, and more specifically to a technique which is effective when applied to an electrically erasable Read Only Memory (ROM) device whose memory cells each consist of MISFET having a floating gate electrode and a control gate electrode, that is an EEPROM (Electrically Erasable and Programmable ROM).

Each memory cell of an EEPROM consisting of a MISFET (Metal Insulator Semiconductor Field Effect Transistor) having a floating gate electrode and a control gate electrode is described, for example, in 1984 "International Electron Devices Meeting, Technical Digest", pp 468–471.

In the memory cell described above, a strong electric field of higher than 10 MV/cm is applied to a thin oxide film below a floating gate in order to cause tunnel injection of electrons into the floating gate from a substrate through the thin oxide film to cause tunnel emission of the electrons into the substrate from the floating gate. The overlap area between the floating gate and a control gate of the memory cell must be large enough for tunneling the electrons sufficiently to write or erase the information to and from the memory cell. The memory cell consists of two elements, that is, a memory transistor and a select transistor. For these reasons, the memory cell is about five times greater in size than the memory cell of an EPROM having the same floating gate and control gate.

To reduce the cell size, therefore, a one-element type memory cell having a floating gate electrode and a control gate electrode has been proposed (1985 International Electron Devices Meeting, Technical Digest, pp. 616–619). In this memory cell, injection (write) of the electrons into the floating gate is made by the injection of hot electrons generated at the edge of a drain region while emission (erase) of the electrons from the floating gate is made by tunnel emission into a source region.

SUMMARY OF THE INVENTION

In the memory cell described above, the write operation is made by generating the hot electrons at the edge of the drain region while passing a drain current so that great quantities of hot carriers must be generated when a drain junction undergoes breakdown. In the erase operation, on the other hand, a tunnel must result between the floating gate and the source region by applying a voltage above about 10 V to the source region. Therefore, a breakdown voltage between the source region and the substrate must be at least 10 V and avalanche breakdown must be prevented at the time of erase.

According to studies made by the inventors of the present invention, since it has been found difficult to provide the same structure to the source and drain regions of a MISFET, they must be provided with suitable structures of their own.

Since the write operation to the memory cell is executed by utilizing the hot electrons, power consumption becomes significant.

Our studies reveal that in order to reduce the power consumption and to shorten the write execution time, that is, to improve the write efficiency with a small current, the edge of the drain region must have a structure in which the hot electrons can be generated easily.

On the other hand, it is a general trend in the art to use a single 5 V power source for the write and erase operations of an EEPROM and to generate the write and erase high voltage by having a built-in booster circuit disposed in the same chip. For this purpose, too, the write efficiency must be improved using a small current.

It is therefore an object of the present invention to provide a semiconductor memory device having memory cells which have high write efficiency and which can erase reliably the memory content.

It is another object of the present invention to provide a semiconductor memory device having memory cells with improved erase characteristics by raising the breakdown voltage between a source region and a substrate.

It is still another object of the present invention to provide a semiconductor memory device having memory cells capable of a high speed operation.

These and other objects and novel features of the present invention will become more apparent from the following description when taken in conjunction with the accompanying drawings.

The exemplified embodiments which follow are illustrative of the invention disclosed herein.

In a memory cell consisting of a MISFET (Metal Insulator Semiconductor Field Effect Transistor) having a floating gate electrode and a control gate electrode, its drain region is constituted by a semiconductor region having a high impurity concentration while the edge portion of its source region on the side of a channel region is constituted by a semiconductor region having a low impurity concentration.

According to the means described above, the electric field at the edge of the drain region can be increased so that the quantity of electrons generated increases and the write efficiency can be therefore improved. Since the avalanche breakdown voltage between the source region and a semiconductor substrate can be enhanced, the erase efficiency by a tunnel can be improved.

BRIEF DESCRIPTION OF THE DRAWINGS

FIGS. 4 through 16 are sectional views or plan views in the production steps of the memory cell of the first embodiment;

FIGS. 17 and 18 are sectional view of the memory cells of other embodiments of the present invention;

FIGS. 30 through 35 are plan views or sectional views of the memory cell of FIG. 27 in its production process;

FIGS. 37 through 41 are sectional views of the memory cell of the embodiment shown in FIG. 36 in its production process; and FIGS. 42 through 44 are sectional views of the memory cells in accordance with other embodiments of the present invention.

DESCRIPTION OF THE PREFERRED EMBODIMENTS

Figure 1:
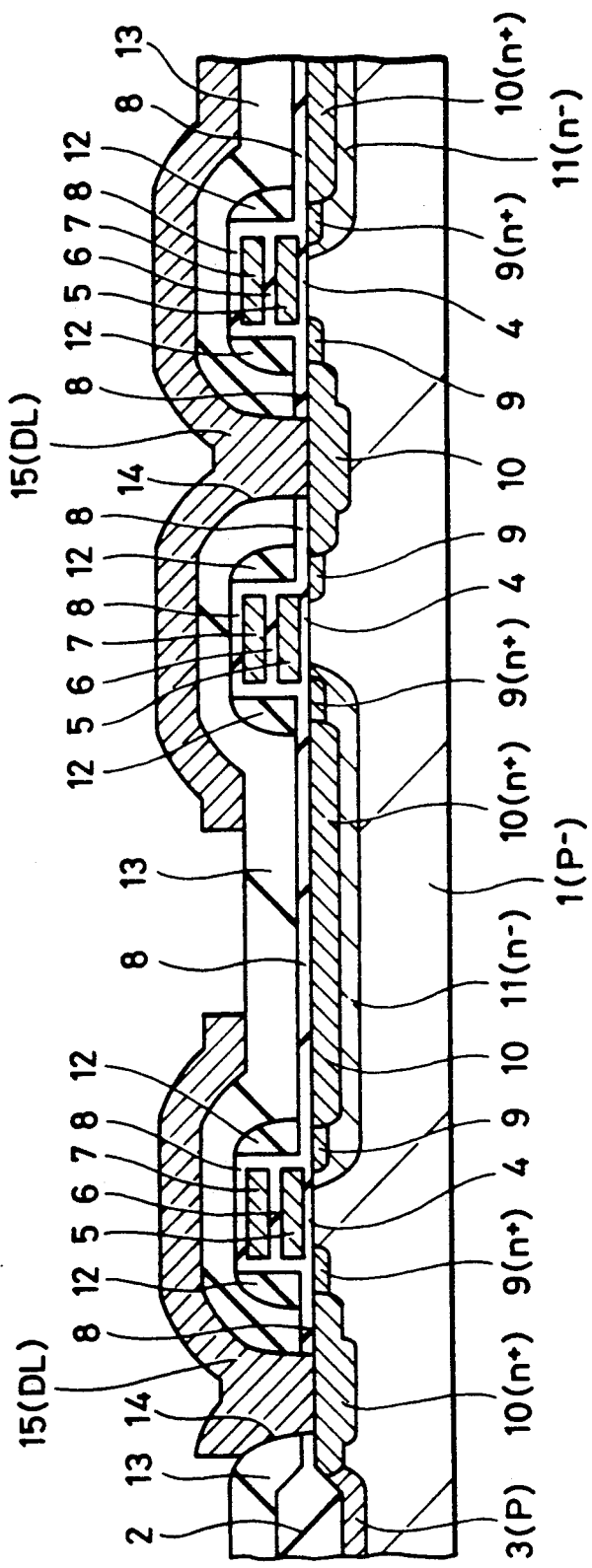
FIG. 1 shows a memory cell of an EEPROM in accordance with the first embodiment of the present invention and is a sectional view taken along line A—A of FIG. 2.
Figure 2:
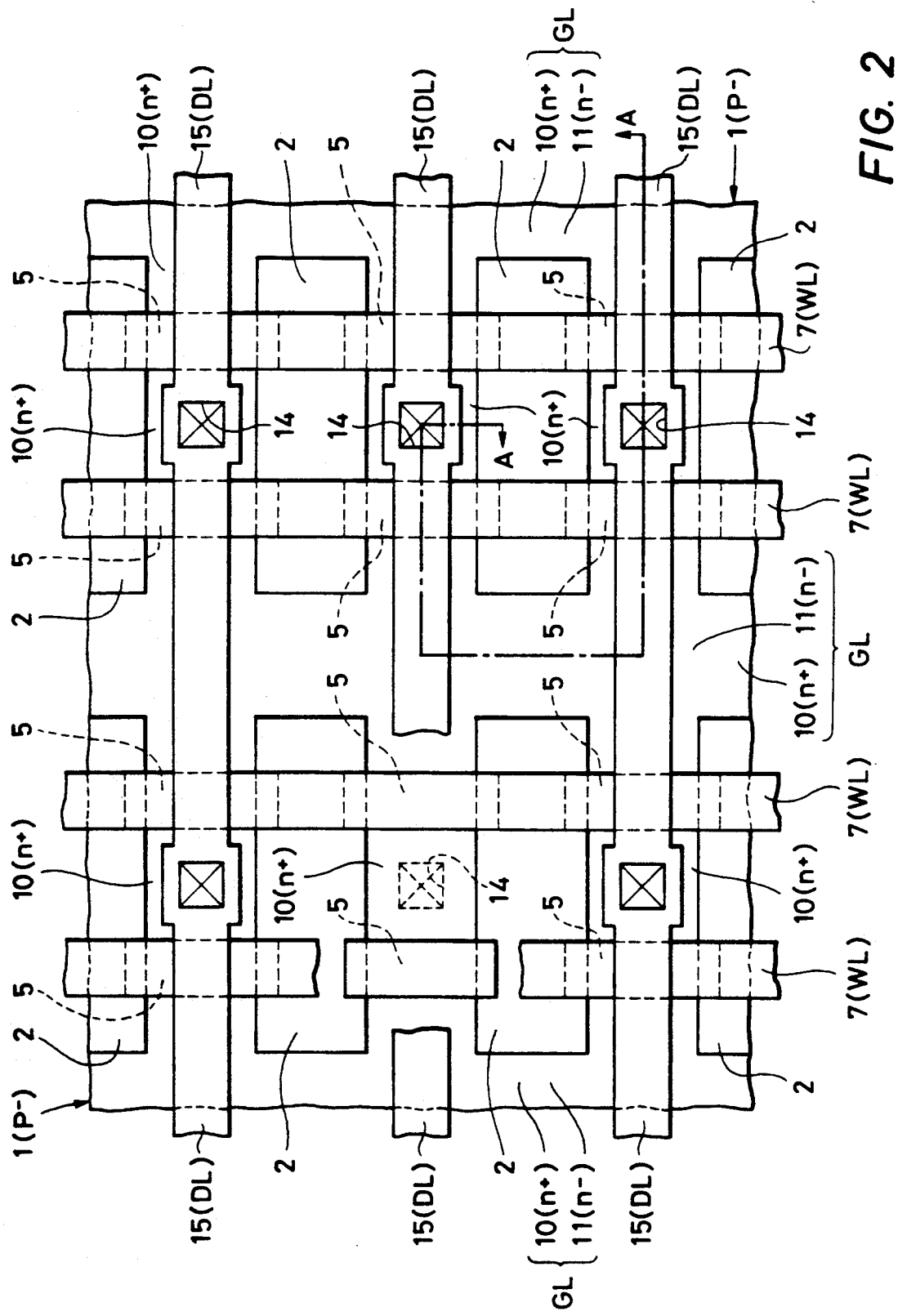
FIG. 2 is a plan view of the memory cell of the first embodiment.
Figure 3:
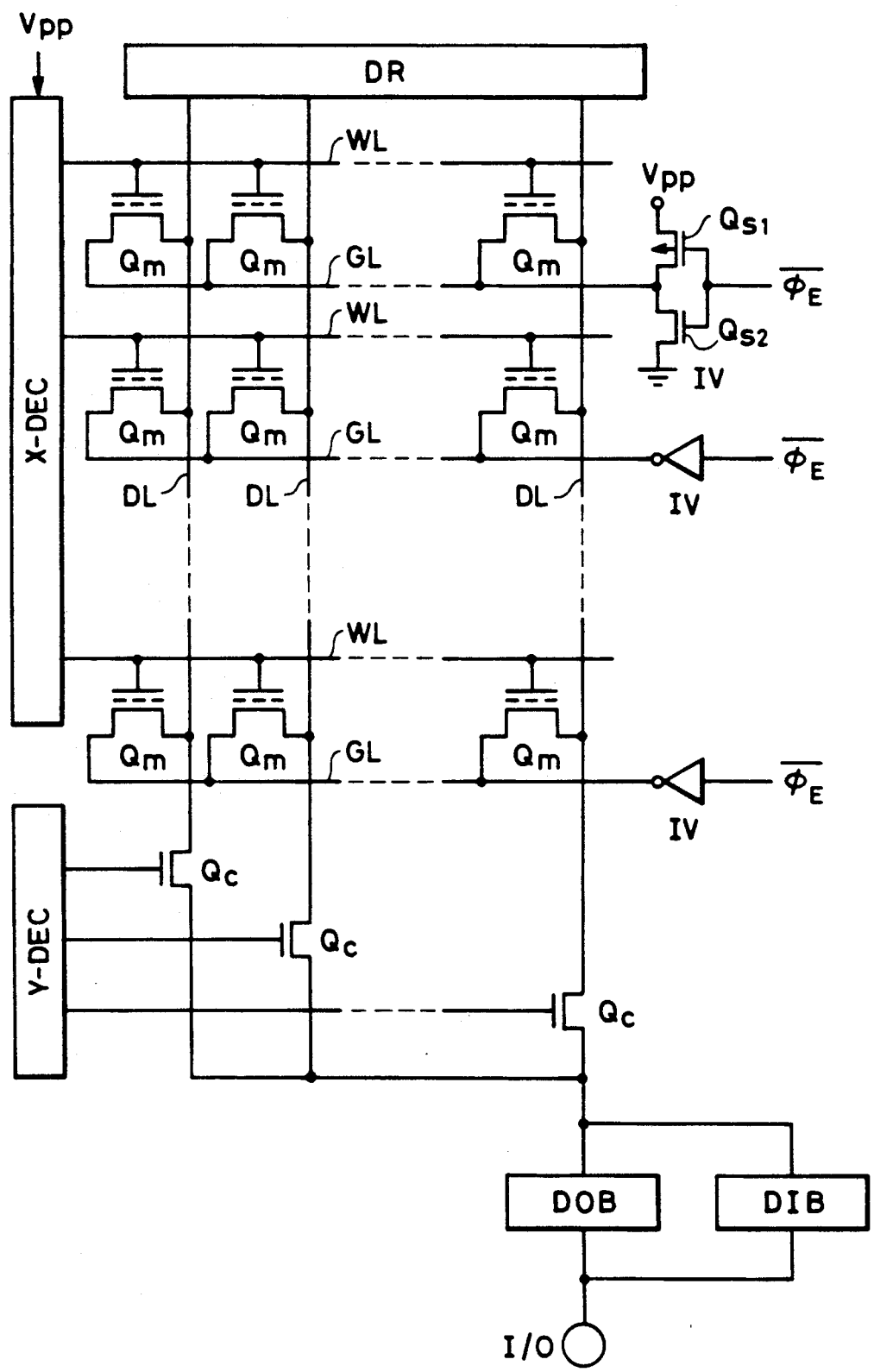
FIG. 3 is an equivalent circuit diagram of the memory cell array of the first embodiment.

FIGS. 1 through 3 show an EEPROM in accordance with the first embodiment of the present invention. FIG. 1 is a sectional view of the memory cell array shown in FIG. 2 along line A—A, FIG. 2 is a plan view of part of the memory cell array and FIG. 3 is an equivalent circuit diagram. Incidentally, insulating films other than a field insulating film are not shown in FIG. 2 in order to simplify the illustration while part of a conductor layer and part each of semiconductor region 9, insulation film 12 and semiconductor region 11 are omitted.

This EEPROM will be outlined with reference to FIG. 3.

Each memory cell Qm consists of a MISFET having a floating gate electrode and a control gate electrode. The control gate electrode of MISFET Qm is connected to a word line WL while its drain region is connected to a data line DL with its source region being connected to a ground potential line GL. The data line DL and the ground potential line GL are in parallel with each other and extend in a direction crossing the word line WL. In other words, the memory cell array consists of the memory cells Qm, the word lines WL, the data lines DL and the ground potential line GL. One of the ends of each word line WL is connected to an X decoder X-DEC as a word line selecting circuit. One of the ends of each data line DL is connected to a data line drive circuit DR with its other end being connected to input/output circuits DOB and DIB through n-channel MISFET Qc forming a column switch circuit. The output of a Y decoder Y-DEC as a data line selecting circuit is supplied to the gate electrode of MISFET Qc. The output of a CMOS inverter circuit IV consisting of P-channel MISFET Qs1 and n-channel MISFET Qs2 is supplied to the ground potential line GL. An erase signal $\phi_E$ is supplied to the input terminal of the inverter circuit IV, that is, the gate electrodes of MISFETs Qs1 and Qs2. The output circuit DOB inclusive of a sense amplifier circuit amplifies the signal applied to the selected data line DL in the read cycle and outputs it to input/output external terminals I/O. The input circuit DIB supplies the signal applied to the external terminal in the write cycle to the data line DL. Those circuits other than the memory cell array, that is, peripheral circuits, consist of CMOS circuits such as the inverter circuit IV and operate statically.

The write, read and erase operations of this EEPROM are carried out in the following way.

In the data write and read operations, the inverter circuit IV applies the ground potential Vss, e.g. 0 V, of the circuit to the ground potential line GL through MISFET Qs2 which is turned ON by the high level of the signal $\phi_E$ and in the data erase operation, supplies an erase voltage $V_{pp}$, e.g. 14 V, through MISFET Qs1 which is turned ON by the low level of the signal $\phi_E$. In the data erase cycle, all the word lines WL and all the data lines DL are set to the low level by the circuits X-DEC and Y-DEC that receive the signal $\phi_E$. In other words, the memory contents of all the memory cells are altogether erased in this embodiment.

In the write cycle, the write circuit DIB supplies the power source voltage $V_{cc}$, e.g. 5 V, to the selected one data line DL. Before this write operation, all the data lines DL are precharged in advance to the ground potential Vss, e.g. 0 V, of the circuit by the drive circuit DR. In the read cycle, all the data lines DL are precharged in advance to the power source voltage Vcc by the drive circuit DR. Thereafter, the potential in accordance with the memory content of one selected memory cell Qm appears on the data line DL.

In the write cycle, the decoder X-DEC supplies a high voltage Vpp, e.g. 14 V, above the power source voltage $V_{cc}$ to one selected word line WL. In the read cycle, the decoder X-DEC supplies a high level signal equal to (or lower than) the power source voltage $V_{cc}$ to one selected word line WL. When the threshold value of the memory Qm MISFET is lower than the selected level of the word line WL, the voltage of the data line DL drops from the voltage $V_{cc}$ due to ON of MISFET Qm. When the threshold value of MISFET Qm is higher than the selected level of the word line WL, the data line DL keeps the precharge level due to OFF of MISFET Qm.

Incidentally, the write operation or the injection of hot carriers is effected only in one memory cell to the word line WL of which the voltage $V_{pp}$ is applied and to the data line DL of which the voltage $V_{cc}$ is applied. The hot carriers are not injected to other memory cells.

The high voltage $V_{pp}$ may be supplied from the external terminal in the write cycle, or be generated from the power source voltage $V_{cc}$ by the built-in booster circuit.

As shown in FIGS. 1 and 2, MISFET Qm as the memory cell consists of a first gate insulation film 4, a floating gate electrode 5, a second gate insulation film 6, a control gate electrode 7, an $n^+$ type semiconductor region 9, an $n^+$ type semiconductor region 10 and an $n^-$ type semiconductor region 11. The first gate insulation film 4 consists of a silicon dioxide film formed by thermal oxidation of the surface of the semiconductor substrate 1 and is about 100 Å thick. The floating gate electrode 5 consists of a polycrystalline silicon film and is deposited on the first gate insulation film 4. The second gate insulation film 6 consists of a silicon dioxide film formed by thermal oxidation of the surface of the polycrystalline silicon film as the floating gate electrode 5 and is from about 250 to about 350 Å thick. The control gate electrode 7 consists, for example, of the second level layer polycrystalline silicon film and is formed on the surface of the second gate insulation film 6. The control gate electrodes 7 of a plurality of MISFETs Qm are formed integrally so as to constitute the word lines WL extending on the field insulation film 2.

The drain region consists of the $n^+$ type semiconductor region 9 and the $n^+$ type semiconductor region 10. The drain regions of the two memory cells connected to the same data line DL through the same contact hole 14 are formed integrally with each other. The edge of the drain region on the side of the channel region consists of the n+ type semiconductor region 9 having a shallow junction depth of about 0.1 μm. Therefore, the extension length of the drain region below the floating gate electrode 5 becomes small. In addition, the electric field at the edge of the drain on the channel region side can be strengthened in the write cycle in comparison with the case where the semiconductor region 9 consists of a semiconductor region having a low impurity concentration. The length of the n+ type semiconductor region 9 in the longitudinal direction of the channel is defined by a sidewall spacer (insulation film) 12 consisting of a silicon dioxide film. The portion of the drain region spaced part from the channel region consists of the n+ type semiconductor region 10 having a deep junction of about 0.25 μm.

The source region consists of the n+ type semiconductor region 9, the n+ type semiconductor region 10 and the n− type semiconductor region 11. These n+ type semiconductor regions 9 and 10 and n− type semiconductor region 11 constituting the source region together form the ground potential line GL. The ground potential line GL extends between two memory cells, which are connected to the same data line DL through two adjacent contact holes 14, in the extending direction of the word line WL. The edge of the source region on the channel region side consists of the n+ type semiconductor region 9 having a shallow junction depth to reduce extension below the floating gate electrode 5. The length of the n+ type semiconductor region 9 in the direction of the channel length is defined by the sidewall spacer 12. The surface portion spaced apart from the channel region consists of the n+ type semiconductor region 10 having a deep junction. An n− type semiconductor region 11 is disposed between the n+ type semiconductor regions 9 and 10, the semiconductor substrate 1 and particularly the channel region of MISFET Qm. Therefore, the breakdown voltage between the source region and the semiconductor substrate 1 can be improved.

The surface of the semiconductor substrate 1 exposed from the field insulation film 2 and the floating gate electrode 5 and the exposed surfaces of the floating gate electrode 5 and control gate electrode 7 are covered with the silicon dioxide film 8. The sidewall spacer 12 consisting of the silicon dioxide film is disposed on the silicon dioxide film 8 on the side surface of the floating gate electrode 5 and control gate electrode 7.

Reference numeral 13 represents an insulation film consisting of a phosphosilicate glass (PSG) film, for example, which covers the semiconductor substrate 1. The contact hole 14 is formed by selectively removing the insulation film 13 on the n+ type semiconductor region 10 as part of the drain region. The data line DL consisting of the aluminum film is connected to the n+ type semiconductor region 10 as part of the drain region through the contact hole 14. The junction depth of this n+ type semiconductor region 10 at its connection portion with the data line DL is greater than at the other portions. Incidentally, a protective film consisting of a PSG film formed by CVD and a silicon nitride film formed on the former covers the data line DL, though not shown in the drawing.

The data is written into the memory cell by applying the afore-mentioned voltage to each of the regions so as to generate the hot carriers at the edge of the n+ type semiconductor region 9 as part of the drain region and to inject the hot electrons into the floating gate electrode 5. The data can be erased by emitting the electrons, that are held by the floating gate electrode 5 in the manner described above, into the n+ type semiconductor region 9 as the source region by tunneling through the first gate insulation film 4.

Incidentally, it is preferred that the threshold voltage of the memory device after erase be set to a small, positive and constant value (enhancement type) such as about 1 V during the erasing operation. If MISFET Qm after erase is of the enhancement type, the memory cell can be made of a one-element type consisting of MISFET Qm. For this purpose, a low voltage of from about 0.5 to about 1.5 V is applied from the drive circuit DR to all the data lines DL in the erase operation of this embodiment. This voltage is determined in consideration of the rise of the floating gate voltage due to coupling of the ground potential line GL with the erasing voltage $V_{pp}$, the substrate effect and the threshold voltage of MISFET Qm after erase.

The n− type semiconductor region 11 is disposed between the n+ type semiconductor regions 9, 10 constituting the source region and the semiconductor substrate 1 in order to improve the breakdown voltage between them so that the erasing voltage to be applied to the source region in the data erase cycle can be enhanced. Therefore, the erase time of data and reliability of the erasing operation can be improved.

Since the edge of the source region is composed of the shallow n+ type semiconductor region 9 having the shallow junction, extension below the floating gate electrode 5 can be reduced and the capacitance between the source region and the floating gate electrode 5 can be reduced. Accordingly, the voltage applied to the first gate insulation film 4 can be increased by the voltage applied to the n+ type semiconductor region 9 forming the source region at the time of the data erasing operation and the data erasing characteristics can therefore be improved.

Since the edge of the drain region on the channel region side is composed of the n+ type semiconductor region 9 having a shallow junction, the capacitance between the drain region and the floating gate electrode 5 can be reduced and the data read-out speed can be improved.

Since the semiconductor region 9 having the shallow junction at the edge of the drain region is of n+ type, the electric field at the drain edge can be increased at the time of the write operation than when it is of the n− type. This means that the hot carriers can be generated highly efficiently and the write voltage can be reduced.

Since the edge of the drain region is composed of the n+ type semiconductor region 9 having a shallow junction, extension below the floating gate electrode 5 can be reduced and hence the short channel effect can be prevented.

Next, the method of producing the memory cell of the first embodiment of the invention will be described.

Figure 7:
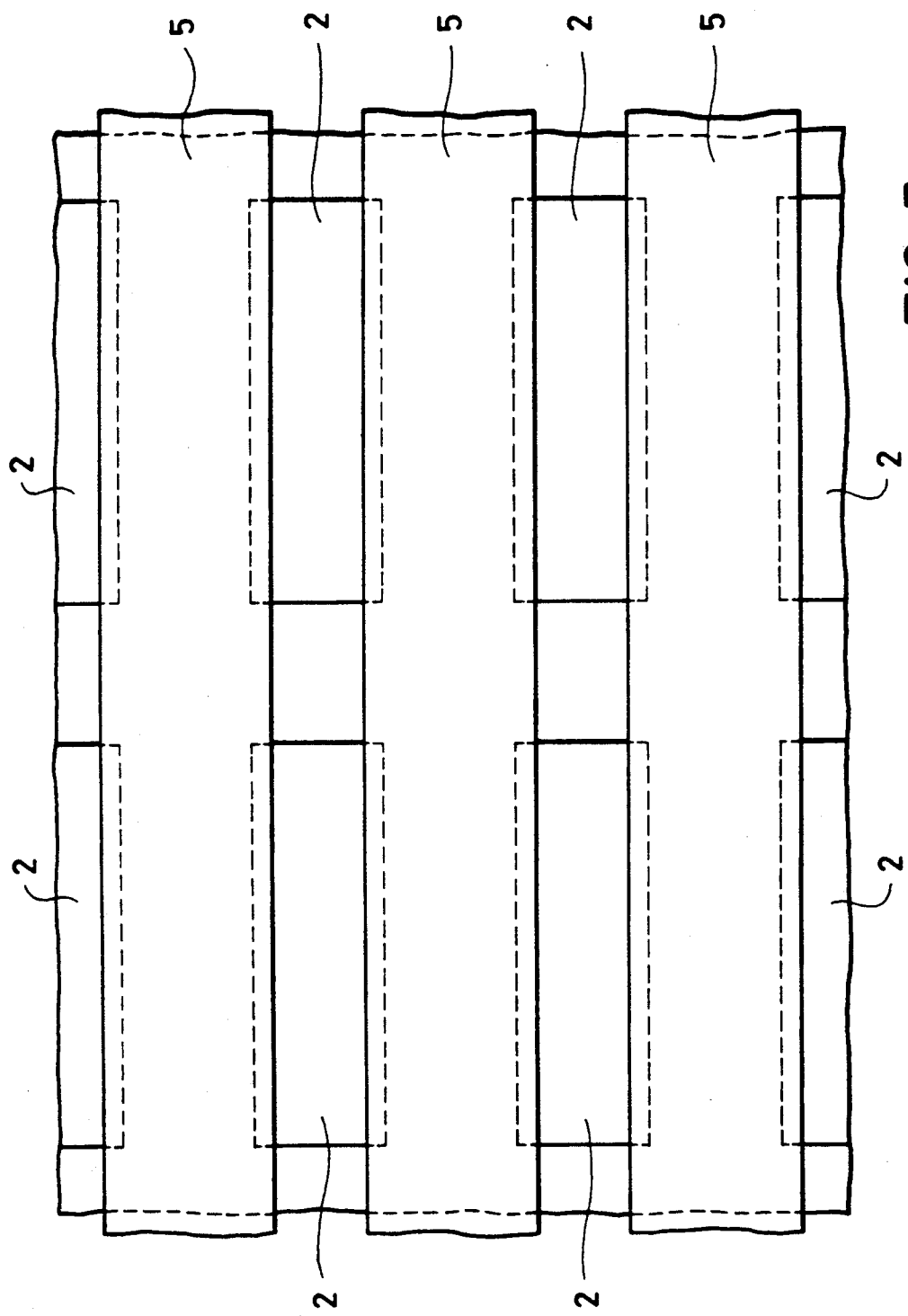

FIGS. 4 through 16, are sectional views of the same portions of the memory cell during its production process as in FIG. 1 and FIG. 7 is a plan view of the same portions of the memory cell as in FIG. 2.

First of all, as shown in FIG. 4, a silicon dioxide film 18 is formed by thermal oxidation of the main plane of a p− type semiconductor substrate 1, and a silicon nitride film 19 by CVD is selectively formed on the silicon dioxide film 18. Then, the predetermined surface of the semiconductor substrate 1 is thermally oxidized by use of this silicon nitride film 19 as the mask, thereby forming a field insulation film 2. A p type channel stopper 3 is formed before the formation of the field insulation film 2, by implanting a p type impurity ion such as boron by use of the silicon nitride film 19 as the mask. After the field insulation film 2 is formed, the silicon nitride film 19 and the silicon dioxide film 18 are removed.

Next, the surface of the semiconductor substrate 1 exposed from the field insulation film 2 is thermally oxidized to form the first gate insulation film 4 having the film thickness described previously and consisting of the silicon dioxide film as shown in FIG. 5.

To form the floating gate electrode 5, a polycrystalline silicon film 4 is formed by CVD, for example, on the entire surface of the semiconductor substrate 1 as shown in FIG. 6. An n type impurity such as phosphorus (P) is introduced into the polycrystalline silicon film 5 by thermal diffusion or ion implantation to reduce its resistance.

Next, as shown in FIG. 7, the polycrystalline silicon film 5 is patterned by etching by use of a resist film (not shown) as the mask in such a fashion that the floating gate electrodes 5 extend with predetermined gaps between them in the extending direction of the data lines DL. In other words, in the etching process the polycrystalline silicon film 5 is patterned in such a manner that the floating gate electrodes 5 of a plurality of memory cells connected to the same data line DL are integrated with one another. The polycrystalline silicon film 5 formed in the peripheral circuit region is removed. After patterning of the polycrystalline silicon film 5, the mask consisting of the resist film is removed.

Next, the surface of the polycrystalline silicon film 5 is oxidized to form a second gate insulation film 6 consisting of a silicon dioxide film as shown in FIG. 8. This film is from about 250 to 350 Å thick. The gate insulation film of MISFETs forming peripheral circuits is formed in this oxidation process. Next, a polycrystalline silicon film 7 is formed on the whole surface of the semiconductor substrate 1 by CVD in order to form the control gate electrode 7 and the word lines WL. To reduce the resistance of the polycrystalline silicon film 7, an n type impurity such as phosphorus is introduced into the film 7 by thermal oxidation, ion implantation or like means.

Then, the polycrystalline silicon film 7 is etched by use of the mask consisting of a resist film (not shown) to form the control gate electrodes 7 and the word lines WL as shown in FIG. 9. The gate electrodes of MISFETs constituting the peripheral circuits are also formed in this etching process. The second gate insulation film 6 exposed from the floating gate electrode 7 is etched in succession to the etching step described above. Furthermore, the polycrystalline silicon film 5 is etched to form the floating gate electrode 5. After a series of these etching steps, the mask consisting of the resist film is removed. Incidentally, the control gate electrode 7, the word line WL and the gate electrode of MISFET of the peripheral circuit may consist of a refractory metal film of Mo, W, Ta, Ti or the like or its silicide film or a two-layered film prepared by laminating the refractory metal film or silicide film described above on the polycrystalline silicon film.

Next, the exposed surfaces of the floating gate electrode 5 and control gate electrode 7 (word line WL) are thermally oxidized to form a silicon dioxide film 8 as shown in FIG. 10. This oxidation process oxidizes the surface of the semiconductor substrate 1 exposed from the floating gate electrode 5 and the control gate electrode 7 and forms the silicon dioxide film 8.

Figure 11:
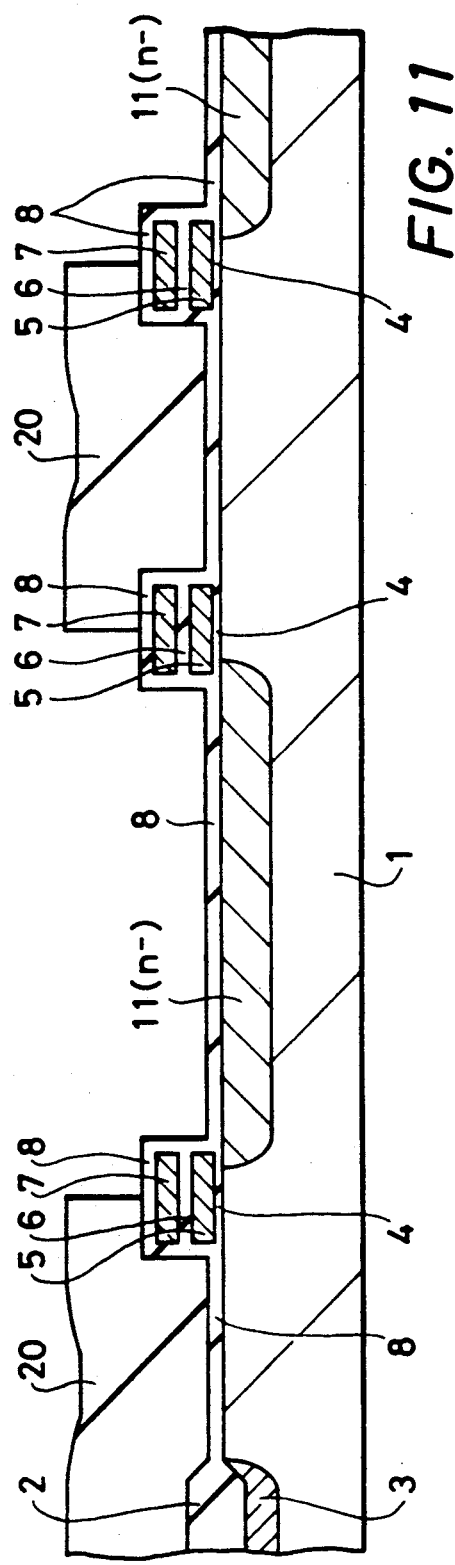

As shown in FIG. 11, a mask 20 consisting of a resist film for forming an $n^-$ type semiconductor region 11 is formed on the semiconductor substrate 1. The mask 20 also covers also the peripheral circuit region. Next, the n type impurity such as phosphorus is introduced in a dose of $1 \times 10^{13}$ to $1 \times 10^{14}$ atoms/cm$^2$ into the exposed surface portion of the semiconductor substrate 1 by ion implantation, thereby forming an $n^-$ type semiconductor region 11. After the ion implantation, this mask 20 is removed. Extension and diffusion may be effected by annealing thereafter in order to provide a deeper junction to the $n^-$ semiconductor region 11 than the $n^+$ type semiconductor region 10 that is to be later formed.

Figure 12:
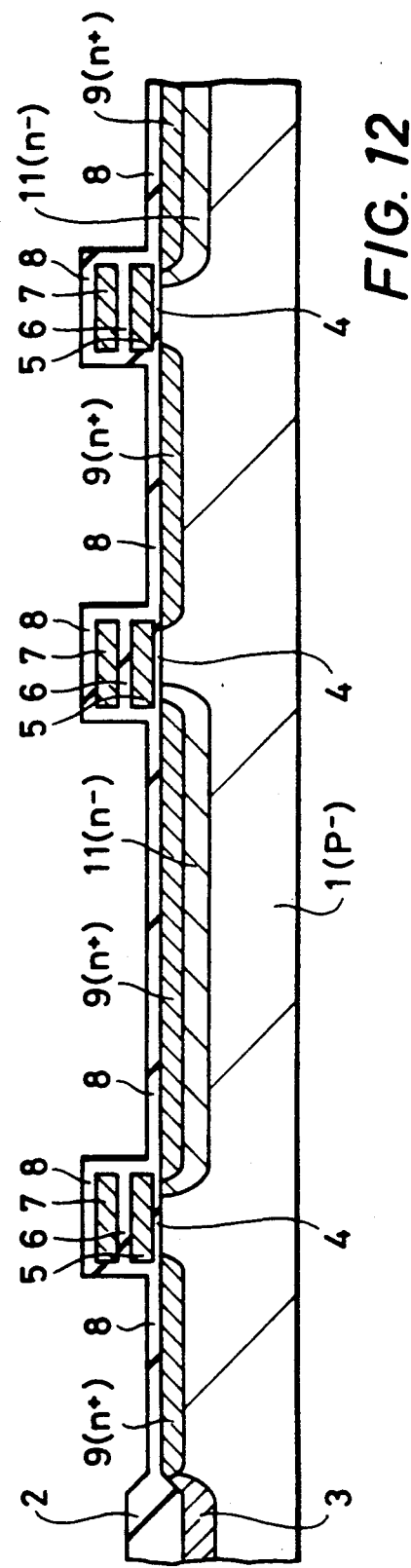

Next, as shown in FIG. 12, an n type impurity such as arsenic is introduced in a dose of about $1 \times 10^{15}$ atoms/cm$^2$ into the surface of the semiconductor substrate 1 by ion implantation using the floating gate electrode 5 and the control gate electrode 7 as the mask so as to form the $n^+$ type semiconductor region 9.

Incidentally, it is possible to change the source and drain regions of the N channel MISFETs constituting the peripheral circuit to an LDD (Lightly Doped Drain) structure in the ion implantation process described above by covering the peripheral circuit region with a mask consisting of a resist film in such a manner as to effect ion implantation only into the memory cell region, then covering further the memory cell region with a mask consisting of a resist film and ion implanting an n type impurity such as phosphorus in a dose of about $1 \times 10^{13}$ atoms/cm$^2$ into the peripheral circuit region. In such a case, the mask consisting of the resist film, which is disposed in the peripheral circuit region, is removed after ion implantation.

Figure 13:
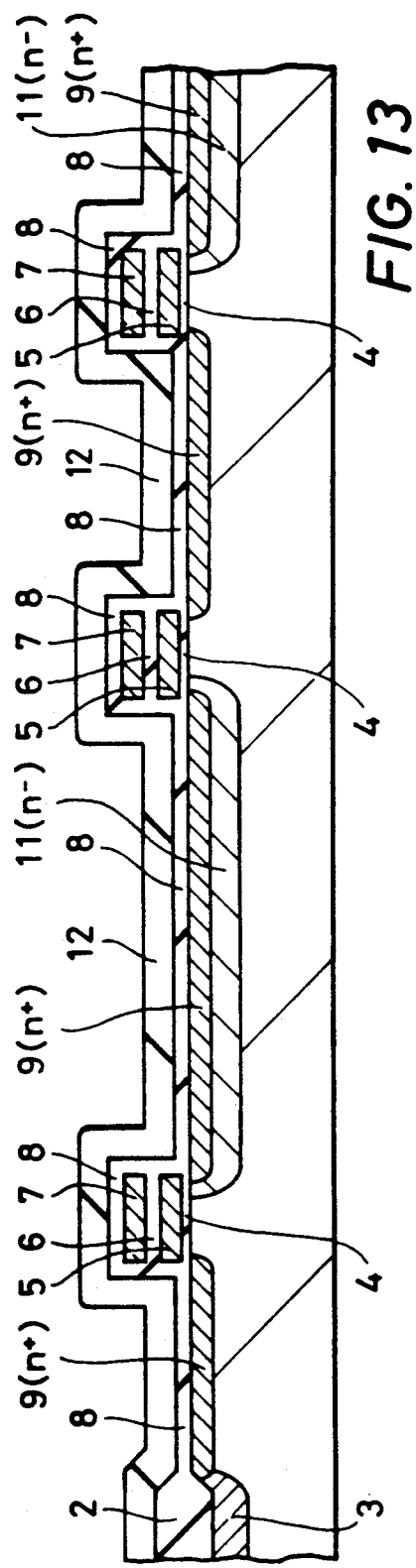

Next, a silicon dioxide film 12 for forming a sidewall spacer 12 is formed by CVD, for example, on the whole surface of the semiconductor substrate 1 as shown in FIG. 13.

Figure 14:
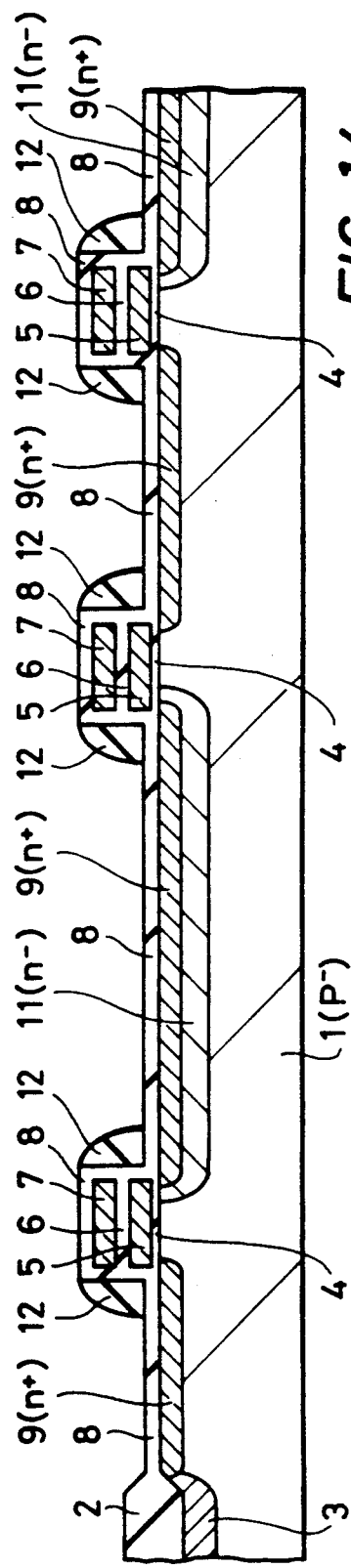

Furthermore, as shown in FIG. 14, the silicon dioxide film 12 is etched by reactive ion etching (RIE) till the surface of the semiconductor substrate 1 is exposed, thereby forming the sidewall spacer 12. This sidewall spacer 12 is formed at the side portion of the gate electrode of MISFET for constituting the peripheral circuit. The surface of the semiconductor substrate 1 exposed by etching is again oxidized to form the silicon dioxide film 8.

Figure 15:
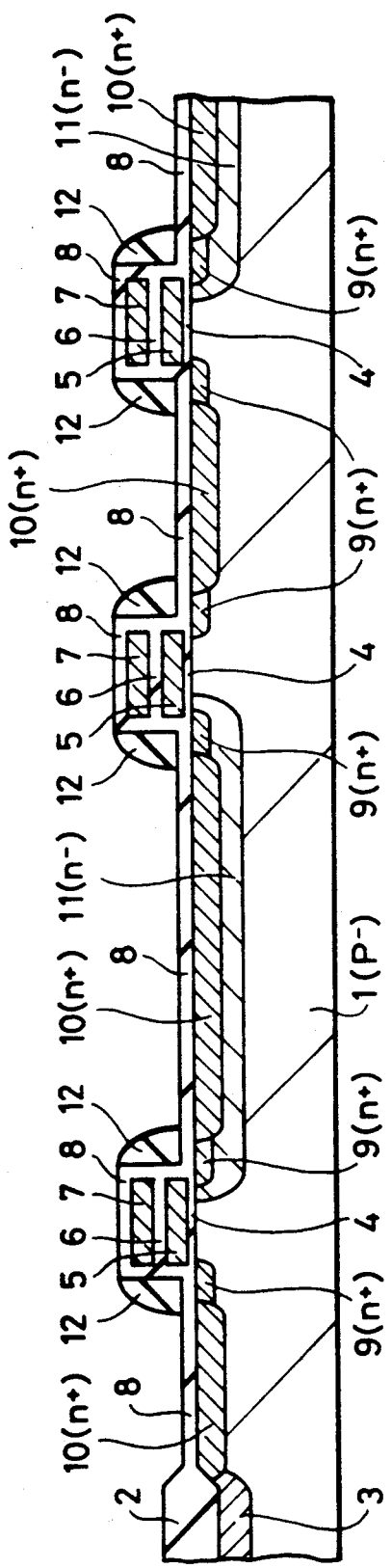

Next, as shown in FIG. 15, an n type impurity such as arsenic is ion-implanted in a dose of about $1 \times 10^{16}$ atoms/cm$^2$ using the floating gate electrode 5, the control gate electrode 7 and the sidewall space 12 as the mask so as to form an $n^+$ type semiconductor region 10. High impurity concentration layers of the source and drain regions of N channel MISFETs of the peripheral circuit are also formed by this ion implantation process. Incidentally, the region of the peripheral circuit where P channel MISFETs are formed is covered with a mask consisting of a resist film in order to prevent the introduction of the n type impurity described above. The mask consisting of the resist film is removed after ion implantation. After the N channel MISFETs are formed, the N channel MISFET region of the peripheral circuit and the memory cell Qm region are covered with a mask consisting of a resist film, not shown, and a p type impurity such as boron is introduced by ion implantation into the P channel MISFET region of the peripheral circuit to form the source and drain regions of P channel MISFET. The mask consisting of the resist film that has covered N channel MISFET and the memory cell Qm region is removed after the introduction of the P type impurity.

Figure 16:
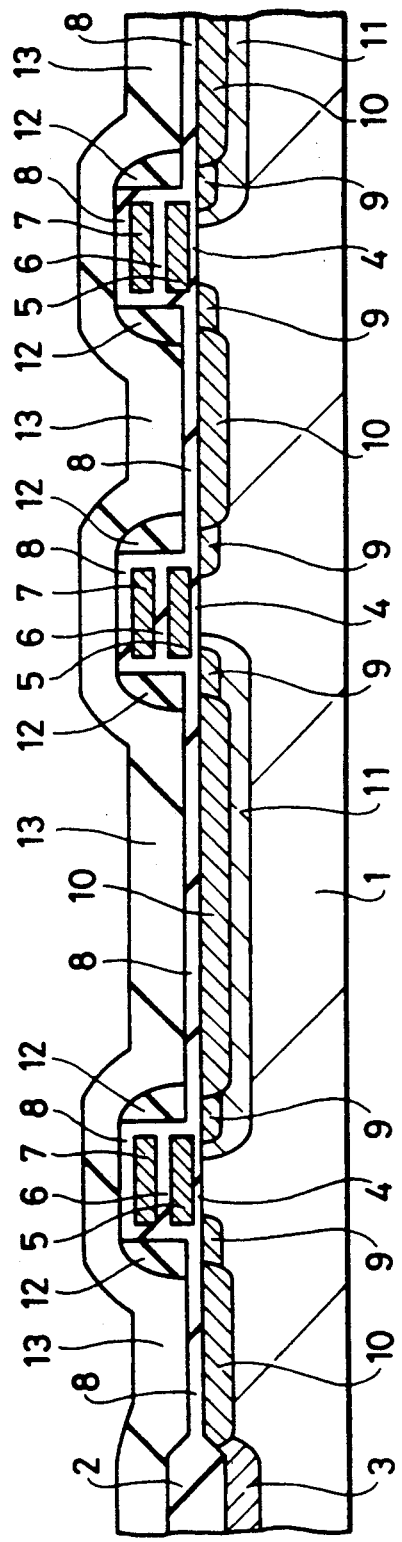

Next, as shown in FIG. 16, an insulation film 13 consisting of a PSG film is formed on the whole surface of the semiconductor substrate 1 by CVD by way of example. Thereafter the contact hole 14 shown in FIGS. 1 and 2, the data line DL consisting of the aluminum film 15 and the final protective film, not shown, are formed.

As described above, in accordance with the production method of this embodiment, the memory cell can be formed by substantially the same production process as that of N channel MISFETs constituting the peripheral circuit.

The $n^-$ type region 11 which is formed only on the source side may be formed in the form such as shown in FIG. 17. In other words, the $n^-$ type semiconductor region 11 is formed shallowly so that only the $n^+$ semiconductor region 9 is covered (contained) by the $n^-$ type semiconductor region 11 while the $n^-$ type semiconductor region 11 is not formed below the $n^+$ type semiconductor region 10. Since the $n^-$ type semiconductor region 11 is shallow, diffusion into the channel region is less. Therefore, the change of the threshold value of MISFET Qm as the memory cell is reduced and its electric characteristics can be improved. Since the short channel effect can be reduced, the characteristics of the memory cell can be improved.

In the production step of the embodiment described above which is shown in FIG. 11, the $n^-$ type semiconductor region 11 may be formed so shallowly that only the $n^+$ type semiconductor region 9 is covered by it. Therefore, the memory cell Qm of this embodiment can be formed by substantially the same production steps as N channel MISFET of the peripheral circuit.

FIG. 18 is a sectional view of the memory cell in accordance with another embodiment of the present invention.

In this embodiment the edge portion of the source region on the channel region side is constituted by an n type semiconductor region 21 having a relatively low impurity concentration, and the edge portion of the drain region on the channel region side is constituted by an $n^+$ type semiconductor region 9 having a shallow junction depth and a high impurity concentration. Since the edge of the source region is constituted by the n type semiconductor region 21, the avalanche breakdown voltage between the source region, that is, the $n^+$ type semiconductor region 10 and the n type semiconductor region 21, and the semiconductor substrate 1 can be increased. Therefore, the erasing voltage to be applied to the source region in the data erase cycle can be enhanced. Incidentally, the n type semiconductor region 21 is about 0.2 μm thick.

On the other hand, since the edge of the drain region on the channel region side consists of the $n^+$ type semiconductor region 9, the electric field to be impressed between this $n^+$ type semiconductor region 9 and the semiconductor substrate 1 can be increased. Therefore, the generation of hot carriers in the data write cycle can be enhanced.

The length each of the $n^+$ type semiconductor region 9 and the n type semiconductor region 21 in the channel length direction is defined by the sidewall spacer 12.

Next, the method of producing the memory cell of the embodiment shown in FIG. 18 will be described.

FIGS. 19 through 23 are sectional views of the memory cell during its production process.

Figure 19:
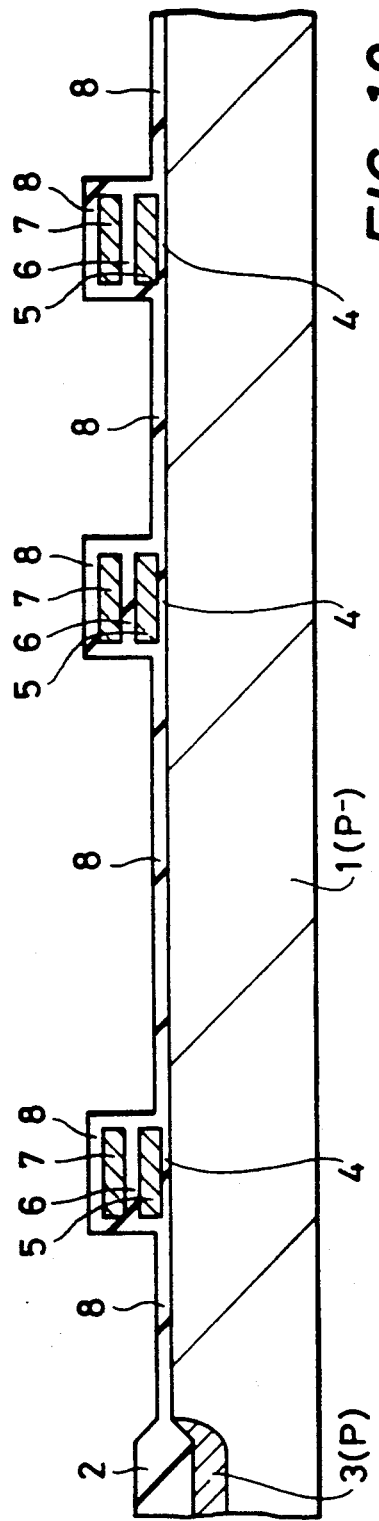
FIGS. 19 through 23 are sectional views of the memory cell of FIG. 18 in its production processes.

As shown in FIG. 19, the floating gate electrode 5, the second gate insulation film 6, the control gate electrode 7 (word line WL) and the silicon dioxide film 8 are formed in the same way as in the first embodiment.

Figure 20:
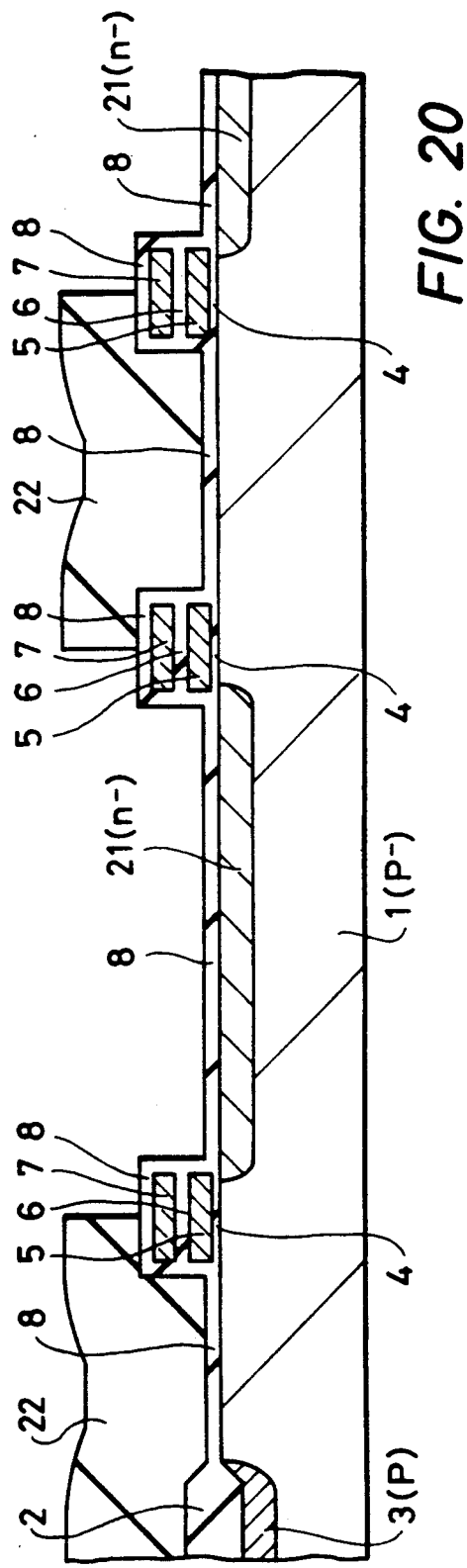

Next, as shown in FIG. 20, a mask 22 consisting of a resist film is formed on a semiconductor substrate 1 so as to cover the drain region of MISFET Qm as the memory cell. The mask 22 is disposed in such a manner as to cover a region where P channel MISFET constituting a peripheral circuit is formed. Next, an n type impurity such as phosphorus is introduced in a dose of about $1 \times 10^{14}$ to $1 \times 10^{15}$ atoms/cm² by ion implantation so as to form an n type semiconductor region 21. Thereafter the mask 22 is removed.

Figure 21:
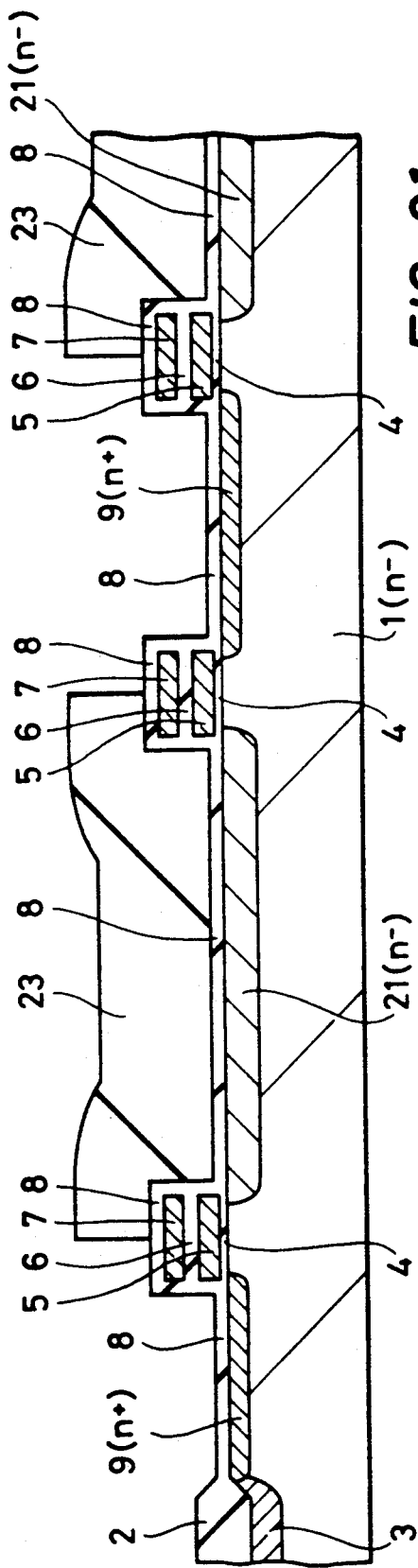

Then, a mask 23 consisting of a resist film is formed in such a manner as to cover the source region of the memory cell Qm and the ground line region as shown in FIG. 21. The mask 23 is formed in such a manner as to cover the P channel MISFET region and N channel MISFET region constituting the peripheral circuit. Next, an n type impurity such as arsenic is introduced in a dose of about $1 \times 10^{15}$ atoms/cm² by ion implantation to form an $n^+$ semiconductor region 9. The mask 23 is removed after ion implantation.

Figure 22:
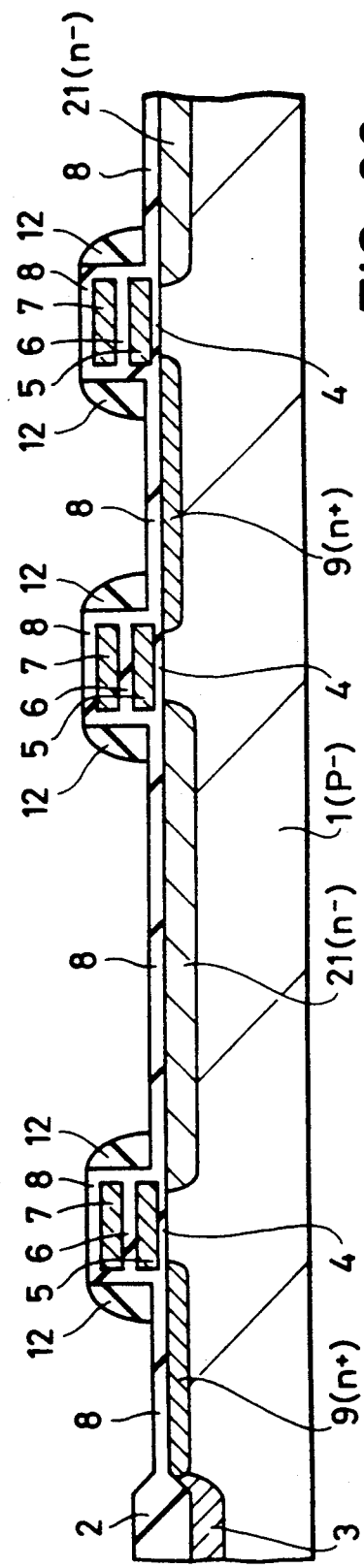

Next, a sidewall spacer 12 consisting of a silicon dioxide film is formed as shown in FIG. 22. The sidewall spacer 12 is formed at the side portions of the gate electrodes of N channel MISFETS and P channel MISFETS of the peripheral circuit, too.

Figure 23:
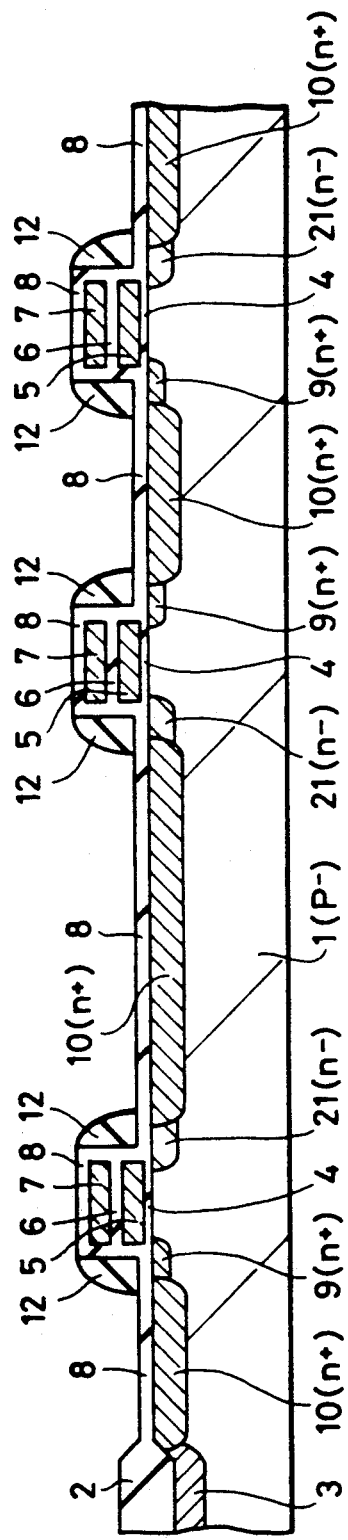

Next, after the region in which P channel MISFET of the peripheral circuit is disposed is covered with a mask consisting of a resist film, an n type impurity such as arsenic is introduced in a dose of about $1 \times 10^{16}$ atoms/cm² by ion implantation as shown in FIG. 23 so as to form an $n^+$ type semiconductor region 10. This $n^+$ type semiconductor region 10 is formed also in the source and drain regions of N channel MISFET of the peripheral circuit. After ion implantation, the mask consisting of the resist film, that has covered the P channel MISFET region of the peripheral circuit, is removed.

By the production steps described so far, the edge of the source region of MISFET Qm as the memory cell is constituted by the n type semiconductor region 21 and the edge of the drain region is constituted by the $n^+$ type semiconductor region 9. In the N channel MISFET of the peripheral circuit, the edge of the drain region is constituted by the n type semiconductor region 21.

Incidentally, it is possible to form the mask 23 shown in FIG. 21 in such a fashion as to cover the whole region of the P channel MISFET region and only the drain region of an N channel MISFET region but to expose the source region of an N channel MISFET region. According to this arrangement, in the N channel MISFET of the peripheral circuit, the edge of the drain region is constituted by the $n^+$ type semiconductor region 9 and the edge of the source region is constituted by the n type semiconductor region 21. Therefore, the electric field at the edge of the drain region can be mitigated and since the edge of the source region is of the $n^+$ type, transconductance $g_m$ can be enhanced.

The subsequent production steps are the same as those of the first embodiment.

Figure 24:
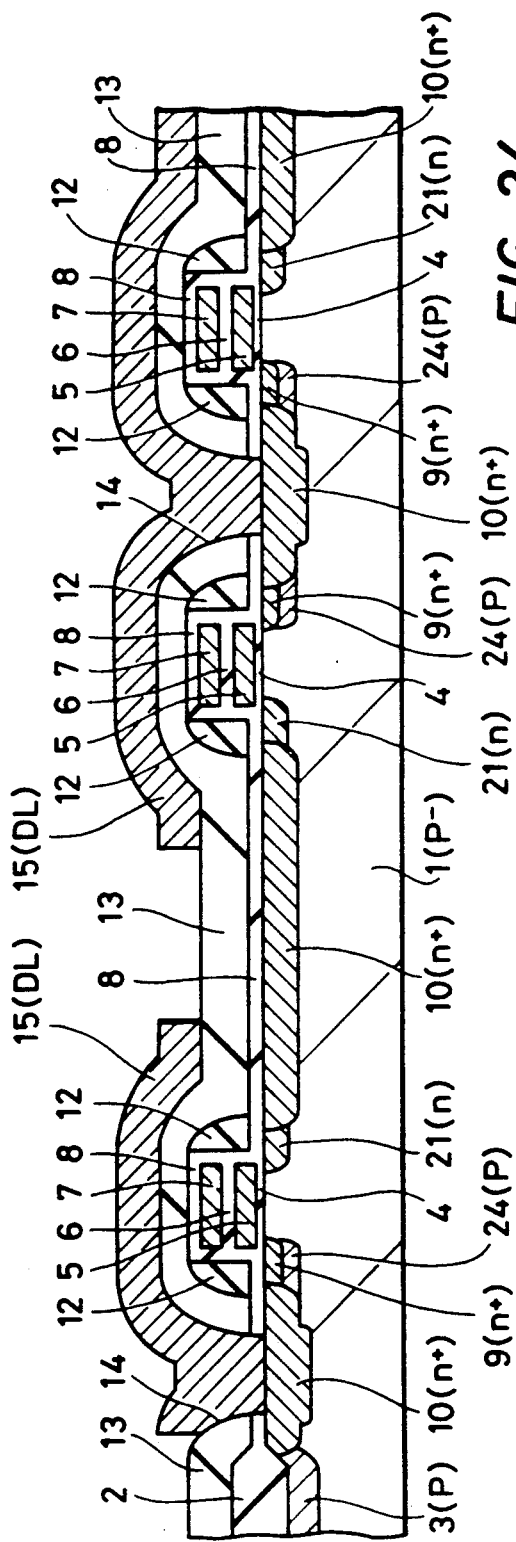
FIGS. 24 through 27 are sectional views in accordance with still another embodiment of the present invention.

FIG. 24 is a sectional view of the memory cell in accordance with still another embodiment of the present invention.

In this embodiment the edge of the source region on the channel region side is constituted by an n type semiconductor region 21 while the edge of the drain region is constituted by an n+ type semiconductor region 9. Furthermore, a p type semiconductor region 24 is disposed below this n+ type semiconductor region 9. The edge of the p type semiconductor region 24 on the channel region side is defined by a floating gate electrode 5 and a control gate electrode 7 and its length in the transverse direction of the gate is defined by a field insulation film 2. The p type semiconductor region 24 is disposed only below the n+ type semiconductor region 9 but not below an n+ type semiconductor region 10. For this reason, the generation efficiency of the hot carriers at the edge of the drain region can be enhanced.

The p type semiconductor region 24 may be formed by introducing a p type impurity such as boron (B) in the ion implantation process shown in FIG. 21 before the formation of the n+ type semiconductor region 9. In this manner the p type semiconductor region 24 can be formed without substantial increase in the number of production steps.

If the p type semiconductor region 24 is formed by the step shown in FIG. 21, the p type semiconductor region 24 is formed at the edge of the drain region of N channel MISFET constituting the peripheral circuit, too. The p type semiconductor region 24 in this peripheral circuit is effective for reducing the extension of a depletion layer of the drain region. In other words, it is effective for preventing punch-through. Incidentally, the formation of the p type semiconductor region 24 in N channel MISFET of the peripheral circuit can be prevented by spreading the resist mask 23, that is formed by the steps shown in FIG. 21, on not only the P channel MISFET region of the peripheral circuit region but also on N channel MISFET so as to cover them completely, and then forming the p type semiconductor region 24 only in the memory cell region by ion implantation. The n+ semiconductor region 9 may be formed by forming afresh a mask having such a pattern as to expose the drain region of the memory cell and the drain region of N channel MISFET of the peripheral circuit and consisting of a resist film after removing the above-mentioned mask, and then effecting ion implantation. In this manner the p type semiconductor region 24 can be formed on only the memory cell.

Figure 25:
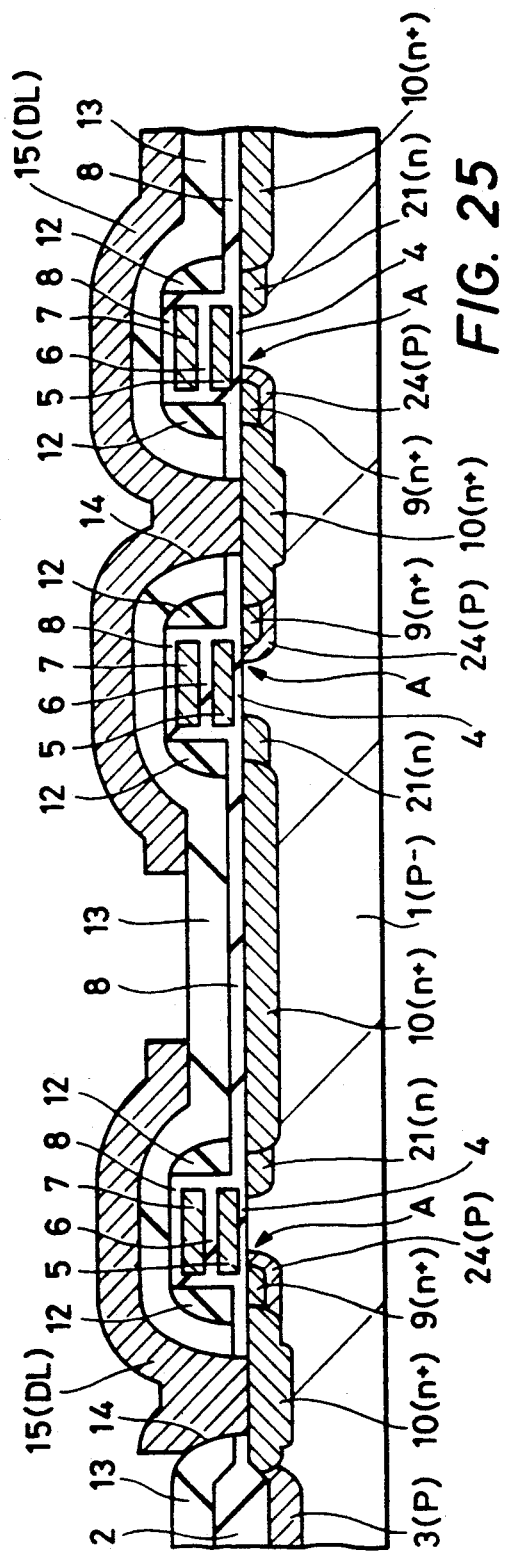

The p type region 24 to be formed only on the drain side may be formed in such a manner as shown in FIG. 25.

This embodiment forms the p type semiconductor region 24 not only at the bottom of the n+ type semiconductor region 9 of the drain region but also on the side surface A on the channel side. The p type semiconductor region 24 is not formed below the n+ type semiconductor region 10. Since the p type semiconductor region 24 is formed on the side surface A of the n+ type semiconductor region 9 on the channel region side, the electric field at the edge of the drain region can be strengthened and the generation efficiency of the hot carriers in the data write cycle can be enhanced.

The p type semiconductor region 24 in this embodiment can be formed in the drain region of N channel MISFET of the peripheral circuit by the same production step in the same way as the P type semiconductor region 24 in the embodiment shown in FIG. 24. It is also possible to prevent the formation of the p type semiconductor region in the peripheral circuit.

Figure 26:
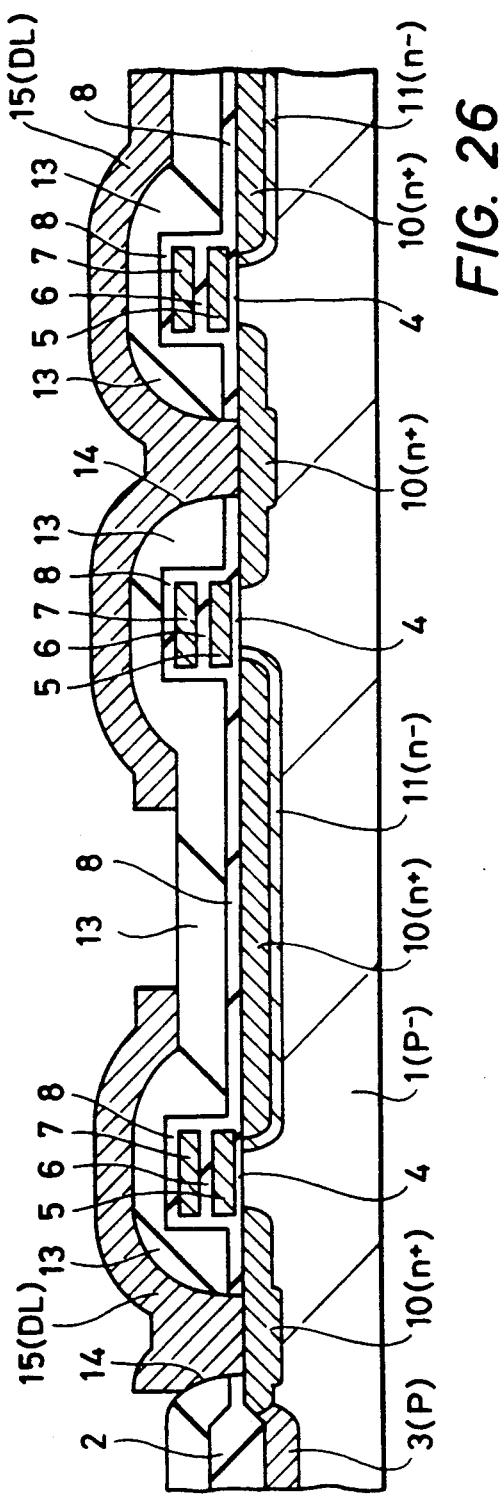

FIG. 26 is a sectional view of the memory cell in accordance with still another embodiment of the present invention.

In this embodiment the drain region of the memory cell Qm consists only of an n+ semiconductor region 10 having a deep junction of about 0.25 μm while the source region consists of the n+ type semiconductor region 10 having a deep junction of about 0.25 μm and an n− type semiconductor region 11 disposed in such a manner as to cover the region 10. Since the n+ type semiconductor region 10 has a deep junction, the concentration distribution is gentle. Furthermore, since the n− type semiconductor region 11 is disposed so as to cover the region 10, the concentration distribution of the source region is further mitigated. Therefore, the junction voltage between the source region and the semiconductor substrate 1 can be enhanced and the data erasing characteristics can be improved.

The n− type semiconductor region 11 can be formed by the same formation method as the n− type semiconductor region 11 of FIG. 11. If the mask 20 shown in FIG. 11 is formed in such a manner that the drain region of the N channel MISFET is open but the P channel MISFET region is covered in the peripheral circuit region, only the drain region of the N channel MISFET of the peripheral circuit can be formed in a double drain structure.

Figure 27:
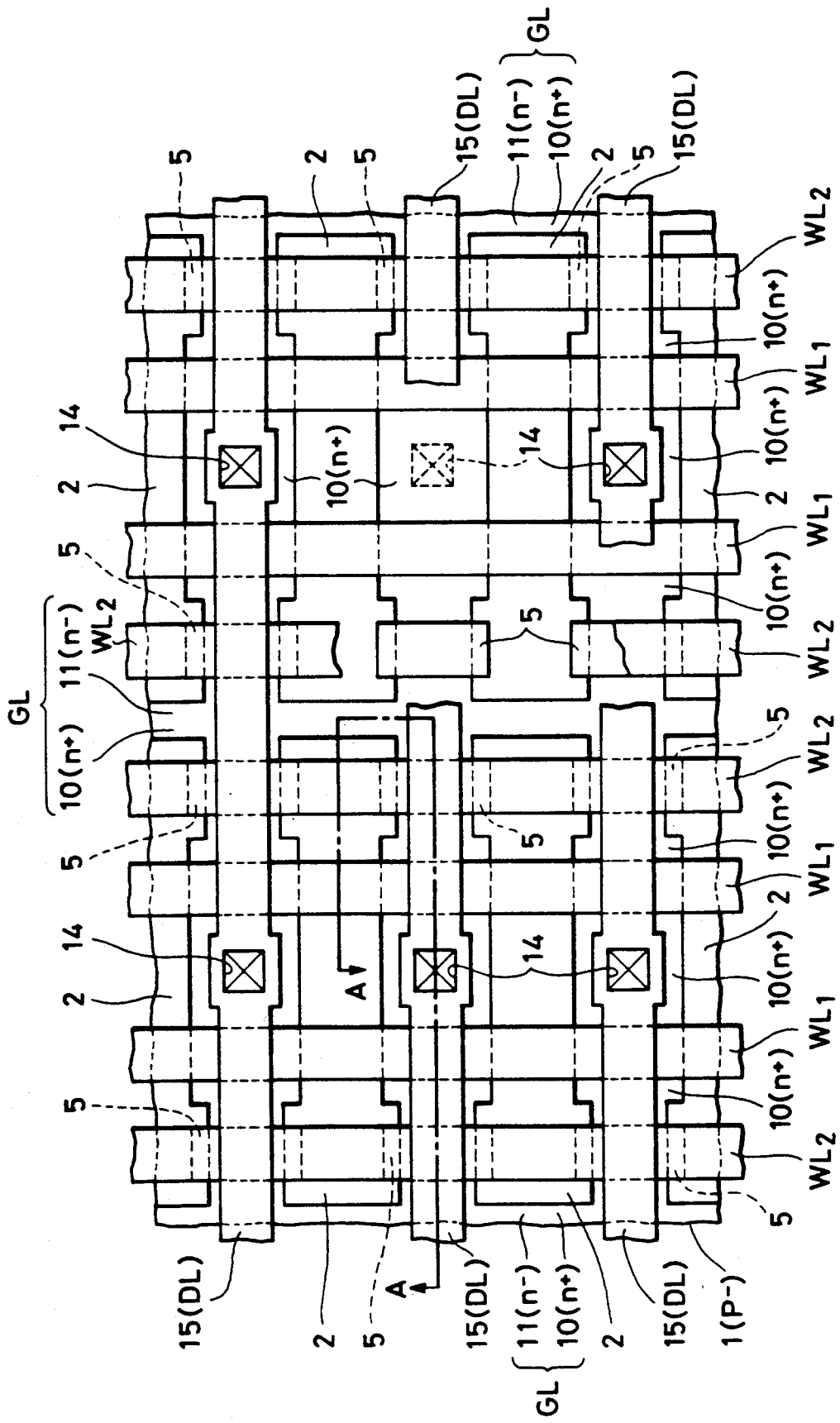
Figure 28:
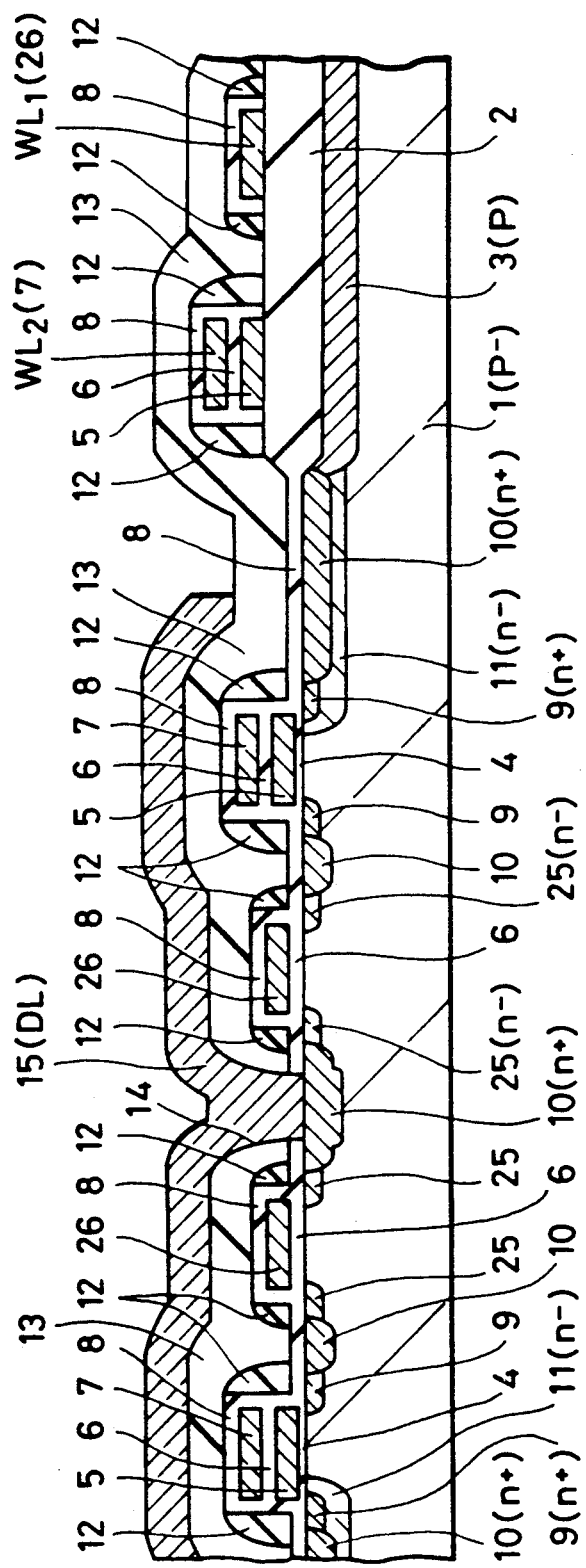
FIG. 28 is a sectional view taken along line A—A of FIG. 27.
Figure 29:
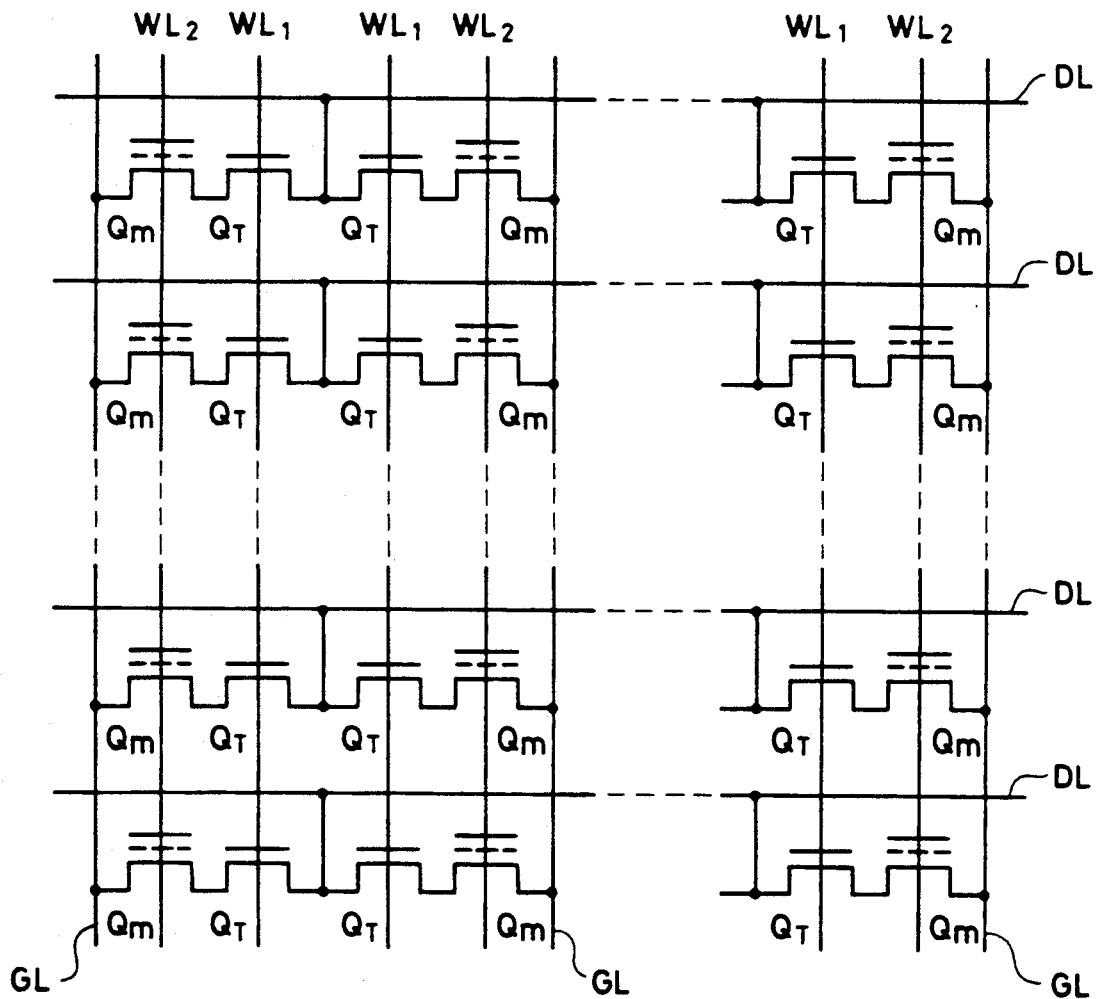
FIG. 29 is an equivalent circuit diagram of the memory cell array of the embodiment of FIG. 27.

FIG. 27 is a plan view of part of the memory cell array in accordance with still another embodiment of the present invention. FIG. 28 is a sectional view taken along line A—A of FIG. 27. FIG. 29 is an equivalent circuit diagram of the memory cell array shown in FIG. 27. The construction of the peripheral circuit in FIG. 29 is substantially the same as that of the embodiment of FIG. 3 and is hence omitted.

In this embodiment, memory cell selecting MISFETs $Q_T$ connected in series with the memory cells Qm are disposed separately from the memory cells Qm so as to constitute one memory cell by these two MISFETs.

In FIGS. 27 through 29, each of the MISFETs of the memory cells Qm consists of the first gate insulation film 4 consisting of the silicon dioxide film, the floating gate electrode 5, the second gate insulation film 6 consisting of the silicon dioxide film, the control gate electrode 7, the n+ type semiconductor regions 9, 10 and the n− type semiconductor region 11 as the source region and the n+ type semiconductor regions 9, 10 as the drain region in the same way as the memory cell of the first embodiment.

MISFET QT that is newly disposed consists of a gate insulation film 6 composed of a silicon dioxide film formed by oxidation of the surface of the semiconductor substrate 1, a gate electrode 26 composed of a second level polycrystalline silicon film, for example, an n− type semiconductor region 25 constituting the edge of the source-drain region on the channel region side and an n+ type semiconductor region 10 constituting the portion of the source-drain region spaced a part from the channel region. The gate electrodes 26 of a plurality of MISFETs $Q_T$ are integrated with one another and form first word lines $WL_1$ that extend in a direction crossing the extending direction of the data line DL. The control gates 7 of a plurality of MISFETS $Q_m$ are integrated with one another to form second word lines $WL_2$ that extend in parallel with the first word lines $WL_1$. Since MISFET $Q_T$ shares the n+ type semiconductor region 10 with MISFET $Q_m$, these MISFETs $Q_T$ and $Q_m$ are connected in series. In the two memory cells that are connected to the same data line DL through the same contact hole 14, the $n^+$ type semiconductor region 10 as the part of the drain region of each selection MISFET $Q_T$ is formed integrally with that of the other. As shown in FIG. 27, the channel width of MISFET $Q_T$ is greater than that of the MISFET $Q_m$ memory device. Each ground potential line GL that is formed integrally with the source region of each MISFET $Q_m$ and extends in the same direction as the extending direction of the word lines $WL_1$ and $WL_2$ is connected to an inverter circuit in the same way as in the embodiment shown in FIG. 3.

In the data write cycle the potential of each ground potential line GL is set to the ground potential $V_{ss}$ of the circuit. The first word line $WL_1$ connected to the selected memory cell is set to the power source voltage $V_{cc}$. The other first word lines $WL_1$ are at the ground potential $V_{ss}$. The second word line $WL_2$ connected to the selected memory cell is set to the write voltage $V_{pp}$ while the other second word lines $WL_2$ are under the floating state or at the ground potential $V_{ss}$. The data line DL connected to the selected memory cell is set to the power source voltage $V_{cc}$ while the other data lines DL are at the ground potential $V_{ss}$.

In the data read cycle, the ground potential line GL is set to the ground potential $V_{ss}$ of the circuit. The first word line $WL_1$ connected to the selected memory cell is set to the power source voltage $V_{cc}$ while the other word lines $WL_1$ are at the ground potential $V_{ss}$. All the second word lines $WL_2$ are set to the power source voltage $V_{cc}$. Incidentally, when the threshold voltage of MISFET $Q_m$ memory device is negative (e.g. $-3$ V) after erase, they are all set to the ground potential $V_{ss}$. The data lines DL are biased by from about 1 to about 2 V by a drive circuit DR (not shown) consisting of a static circuit. The change of the voltage occurring on the data line DL in accordance with the content of the selected memory cell is detected, amplified and outputted.

In the data erase cycle, all the ground potential lines GL are set to the erase voltage $V_{pp}$. All the second word lines $WL_2$ are set to the ground potential $V_{ss}$. The first word lines and the data lines DL are either at the ground potential $V_{ss}$ or are at a floating state. When all of these conditions are established, the data of all the memory cells are erased completely.

According to the memory cell construction of this embodiment, each memory cell consists of MISFET $Q_T$ and the memory device $Q_m$, and there is no need to keep substantially constant the threshold voltage following an erase operation. As a request, the construction of the erase circuit can be simplified.

The occurrence of hot carriers can be reduced because the edge of the source-drain region of MISFET $Q_T$ is constituted by the $n^-$ type semiconductor region 25.

Though the memory device of this embodiment consists of a structure corresponding to the memory cell of the first embodiment, any of the structures of the memory cells of the foregoing embodiments can also be applied.

Next, the production method of the memory cell shown in FIGS. 27 to 29 will be described. FIGS. 30 to 35 are plan or sectional views of the memory cell during the production process.

Figure 30:
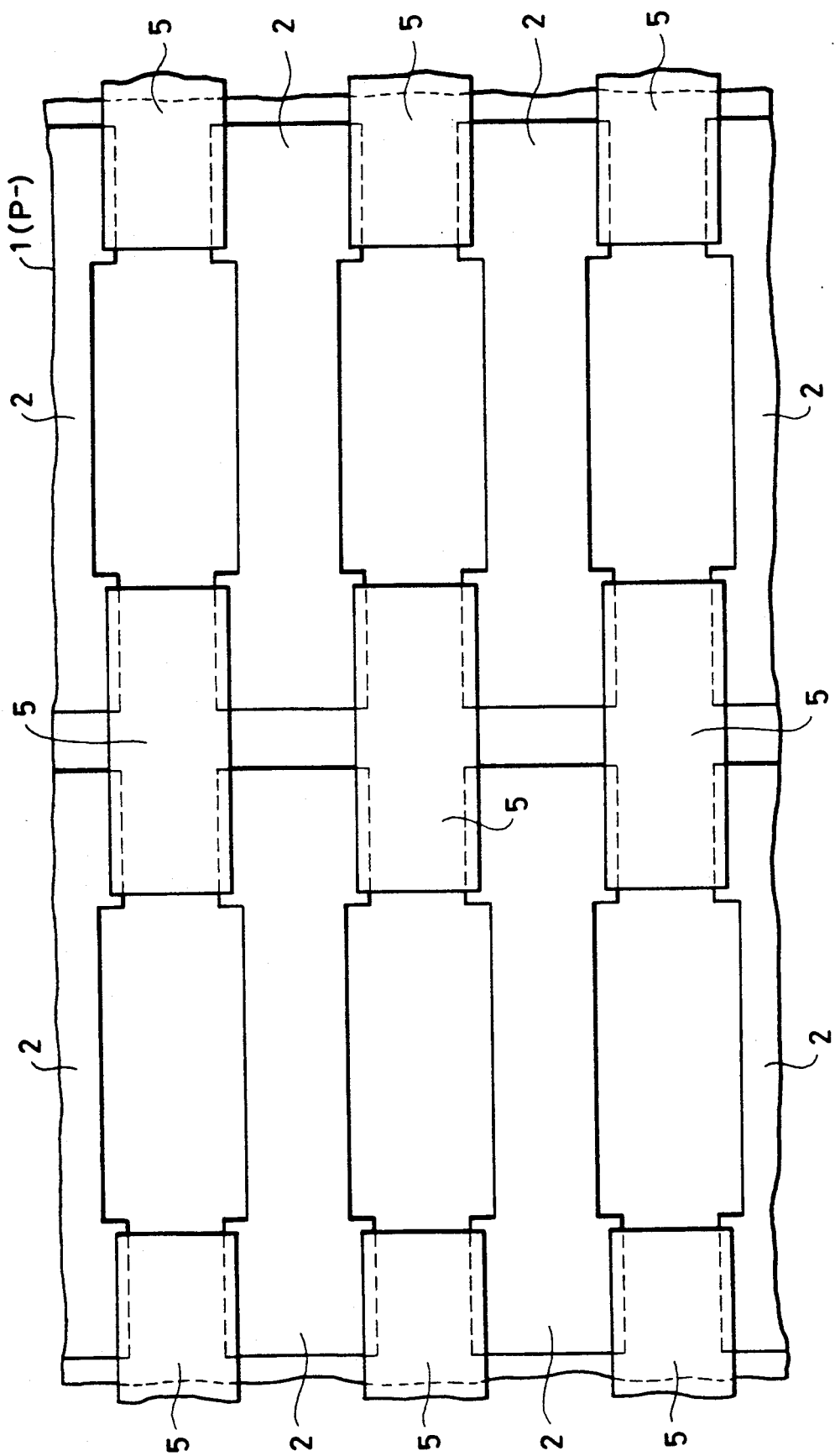

In the same way as shown in FIGS. 4 and 5, a field insulation film 2 and an about 100 Å-thick first gate insulation film 4 are first formed by oxidation of the surface of a semiconductor substrate 1. Next, in the same way as in FIG. 6, a polycrystalline silicon film to serve as a floating gate electrode 5 is formed on the whole surface of the semiconductor substrate 1 by CVD technique, for example. The polycrystalline silicon film is then patterned as shown in FIG. 30 using a mask consisting of a resist film. This etching is made in a pattern such that the floating gate electrodes 5 of two memory cells connected to the same data line DL and share a ground potential line GL are integrated with each other. Therefore, the surface portion of the substrate 1 where a gate electrode 26 (first word line $WL_1$) is disposed is exposed from the polycrystalline silicon film 5.

Next, the exposed surface of the polycrystalline silicon film 5 and the surface of the semiconductor substrate 1 exposed from the polycrystalline silicon film 5 are oxidized so as to form a second gate insulation film 6 and a gate insulation film 6 of MISFET $Q_T$. In the formation process of this gate insulation film 6, the gate insulation film of a MISFET constituting a peripheral circuit can also be formed. Thereafter, a polycrystalline silicon film is formed on the whole surface of the semiconductor substrate 1 by CVD, for example, in order to form a control gate electrode (second word line $WL_2$), a gate electrode 26 (second word line $WL_2$) and the gate electrode of MISFET of a the peripheral circuit, and is then etched for patterning using a mask consisting of a resist film so as to form the gate electrodes 7 and 26 as shown in FIG. 31. In this etching process the gate electrode of MISFET of the peripheral circuit can be formed also. Incidentally, the gate electrodes 7 and 26 may consist of a refractory metal film of Mo, W, Ta, Ti or the like or a silicide film of the refractory metal or a laminate film formed by laminating the refractory metal film or the silicide film on the polycrystalline silicon film. Next, the gate electrodes 5, 7 and 26 and the exposed surface of the semiconductor substrate 1 are oxidized to form a silicon dioxide film 8.

As shown in FIG. 32, a mask 27 consisting of a resist film is formed in order to form an $n^-$ type semiconductor region 11. The mask has a pattern such that it exposes the source region of the memory device $Q_m$ in the memory cell region and covers the whole region of the peripheral circuit region. Next, an n type impurity such as phosphorus is introduced by ion implantation into the surface of the semiconductor substrate 1 exposed from the mask 27 to form the $n^-$ type semiconductor region 11. The mask 27 is thereafter removed.

Figure 33:
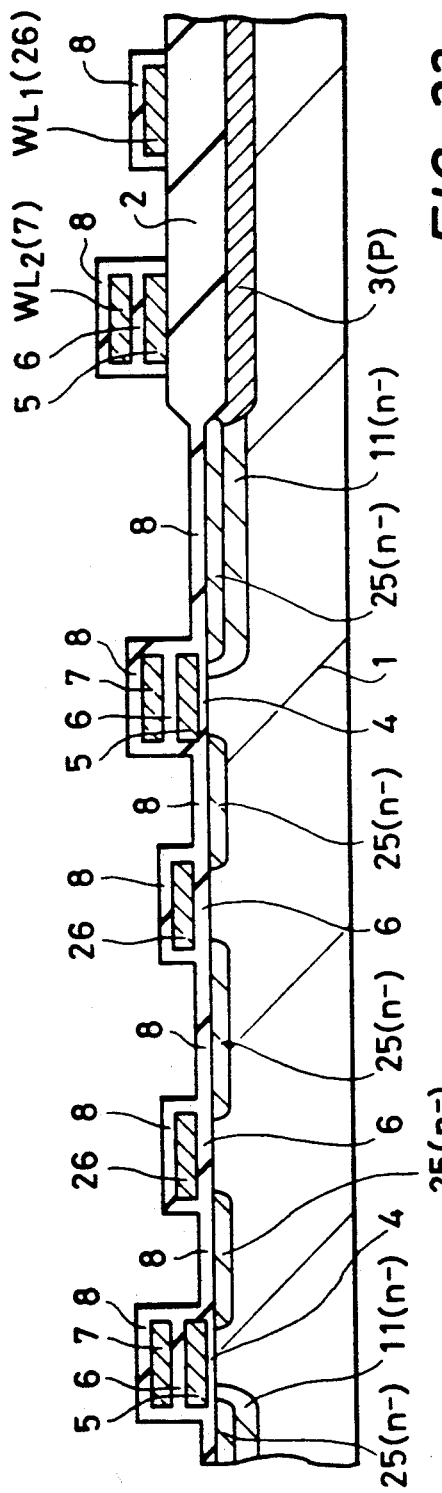

Next, as shown in FIG. 33, an n type impurity such as arsenic or phosphorus is introduced by ion implantation into the surface of the semiconductor substrate 1 using the gate electrodes 5, 7 and 26 as the mask to form an $n^-$ type semiconductor region 25. In this ion implantation process the low impurity concentration layer of the source-drain region of N channel MISFET constituting the peripheral circuit can be formed. The region where P channel MISFET is to be disposed is covered with a mask consisting of the resist film. This mask is removed after the ion implantation process described above.

Figure 34:
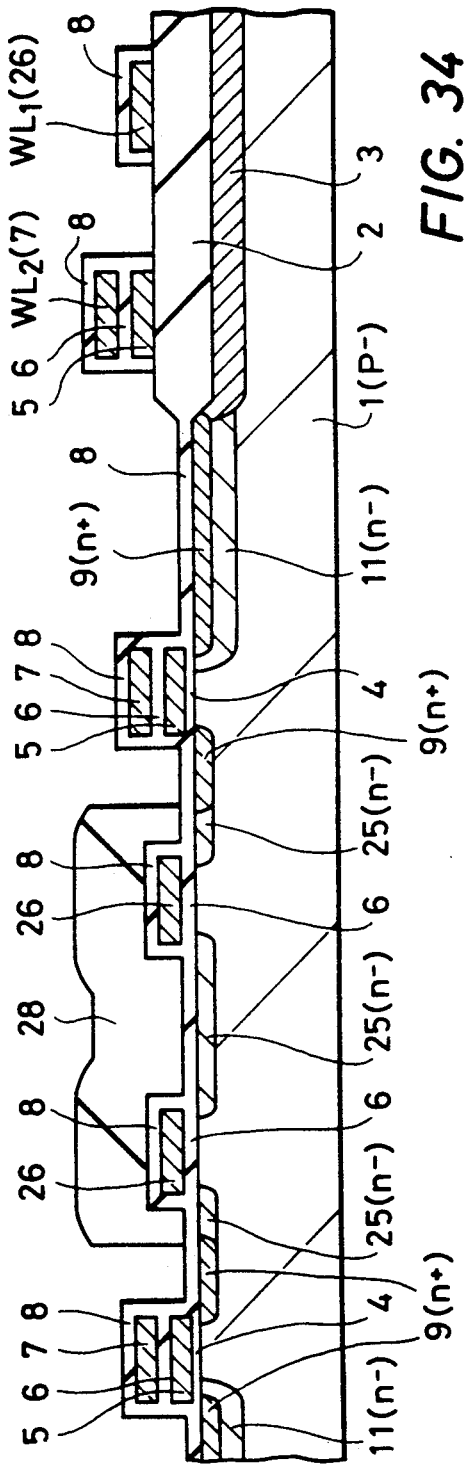

Next, as shown in FIG. 34, a mask 28 consisting of a resist film is then formed on the semiconductor substrate 1 in order to form the $n^+$ type semiconductor region that constitutes part of the source-drain region of the memory device $Q_m$ as shown in FIG. 34. The mask 28 is disposed in such a pattern as to cover the source-drain region of MISFET $Q_T$ in the memory cell region and to cover the whole peripheral circuit region. An n type impurity such as arsenic is introduced into the surface of the semiconductor substrate 1 exposed from the mask by ion implantation using the gate electrodes 5 and 7 as the mask in order to form the n+ type semiconductor region 9. The mask 28 is removed after ion implantation.

Figure 35:
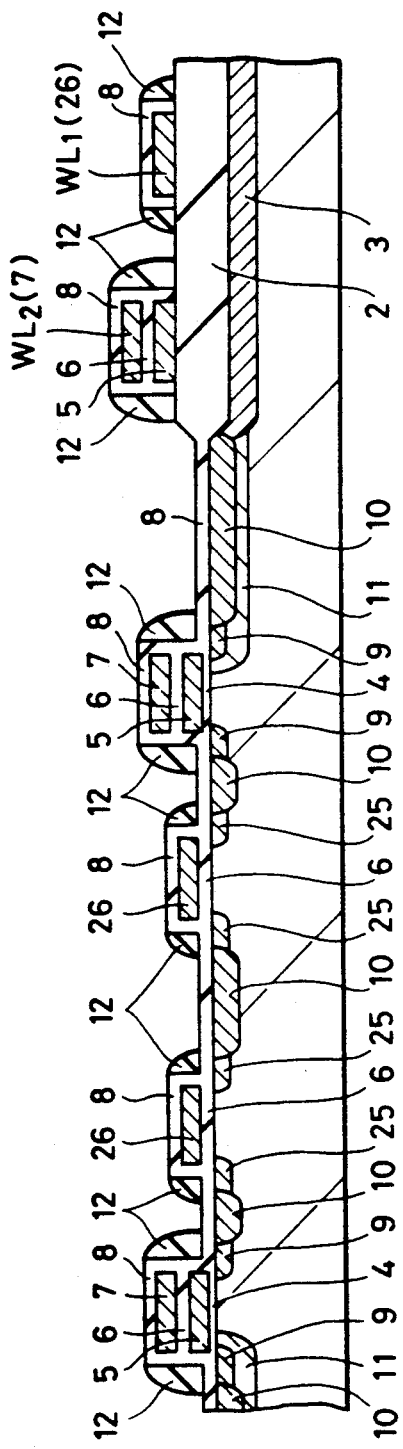

Next, as shown in FIG. 35, a sidewall spacer 12 is formed by reactive ion etching (RIE) of the silicon dioxide film formed on the whole surface of the substrate by CVD, for example. This sidewall spacer 12 is formed on the gate electrodes of both N and P channel MISFETs constituting the peripheral circuit. After the P channel MISFET region is covered with a mask consisting of a resist film, an n type impurity such as arsenic is introduced by ion implantation into the surface of the semiconductor substrate 1 using the sidewall spacer 12 and the gate electrodes 5, 7 or 2, 6 as the mask, thereby forming an n+ type semiconductor region 10 on the surface of the semiconductor substrate 1. The high impurity concentration region of the source-drain region of N channel MISFET for forming the peripheral circuit is formed simultaneously also. After ion implantation, the mask consisting of the resist film that has covered the P channel region is removed. Thereafter, the memory cell region and the N channel MISFET region of the peripheral circuit are covered with a mask consisting of a resist film and a p type impurity such as boron is introduced into the P channel MISFET region to form a p+ type semiconductor region as the source-drain region. The mask consisting of the resist film is removed after ion implantation.

Since the subsequent production steps are the same as those of the production method of the first embodiment, their detail will be omitted.

As described above, MISFET $Q_T$ and MISFET $Q_m$ of the memory cell can be formed substantially simultaneously with each other by the same production process.

Moreover, an N channel MISFET constituting the peripheral circuit and the memory cell can be formed by the same production process.

Figure 36:
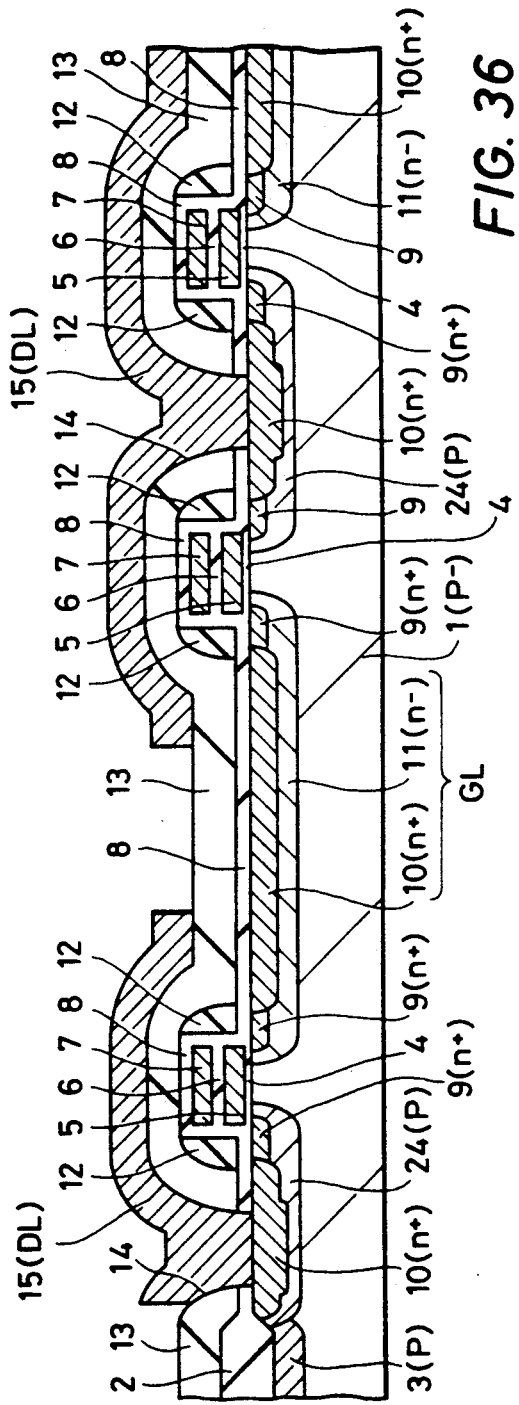
FIG. 36 is a sectional view of the memory cell in accordance with still another embodiment of the present invention.

FIG. 36 is a sectional view of the memory cell in accordance with still another embodiment of the present invention. In this embodiment the memory cell consists of one MISFET, an n− type semiconductor region 11 having a deep junction is disposed in its source region and a p type semiconductor region 24 having a deep junction is disposed in its drain region side, thereby surrounding it. The edges of the source-drain regions on the channel region side consist of an n+ type semiconductor region 9 having a shallow junction of about 0.25 μm. The n− type semiconductor region 11 has a junction which is deeper than the n+ type semiconductor regions 9, 10 as part of the source-drain regions. A region 11 having a low impurity concentration exists between the n+ type semiconductor region 9 and the semiconductor substrate 1 in the channel region on the source side. Since this n− type semiconductor region 11 is disposed between region 9 and the semiconductor substrate 1, the junction voltage between the source region and the semiconductor substrate 1 can be increased so that the erase voltage $V_{pp}$ to be applied in the data erase cycle can be increased to about 13 V and the erasing time can therefore be shortened. Moreover, the erasing operation can be made more reliable.

On the other hand, in the drain region side of the substrate, the p type semiconductor region 24 reaches into a semiconductor substrate depth beneath the entire lower part of the n+ type semiconductor regions 9 and 10 which comprise, on that side of the channel region, the drain region. In the channel region a p type semiconductor region 24 is formed between the n+ type semiconductor region 9 and the semiconductor substrate 1 so as to strengthen the electric field developing between the drain region and the semiconductor substrate 1. Therefore, the generation efficiency of hot carriers can be improved in the data write cycle and the drain voltage at the time of the write operation can be reduced to below about 5 V.

Next, the production method of the memory cell of this embodiment will be described. FIGS. 37 to 41 are sectional views of the memory cell during its production process.

Figure 37:
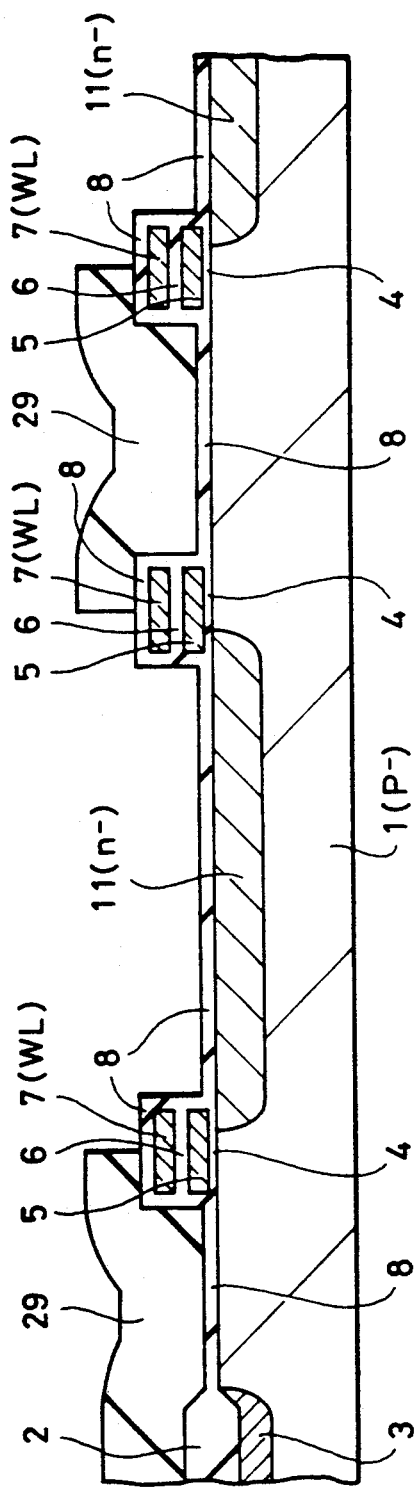

As shown in FIG. 37, a first gate insulation film 4, a floating gate electrode 5, a second gate insulation film 6, a control gate electrode 7 (word line WL) and a silicon dioxide film 8 are first formed in the same way as in the first embodiment. Then, a mask 29 consisting of a resist film is formed on the semiconductor substrate 1 in order to form an n− type semiconductor region 11. This mask 29 is formed in such a pattern as to expose the source region of the memory cell and a ground potential line GL. The peripheral circuit region is covered as a whole with the mask 29. Next, an n type impurity such as phosphorus is introduced in a dose of from $10^{13}$ to $10^{14}$ atoms/cm² by ion implantation into the surface of the semiconductor substrate 1 exposed from the mask 29 and the gate electrodes 5, 7, thereby forming the n− type semiconductor region 11. The mask 29 is removed after this ion implantation.

Figure 38:
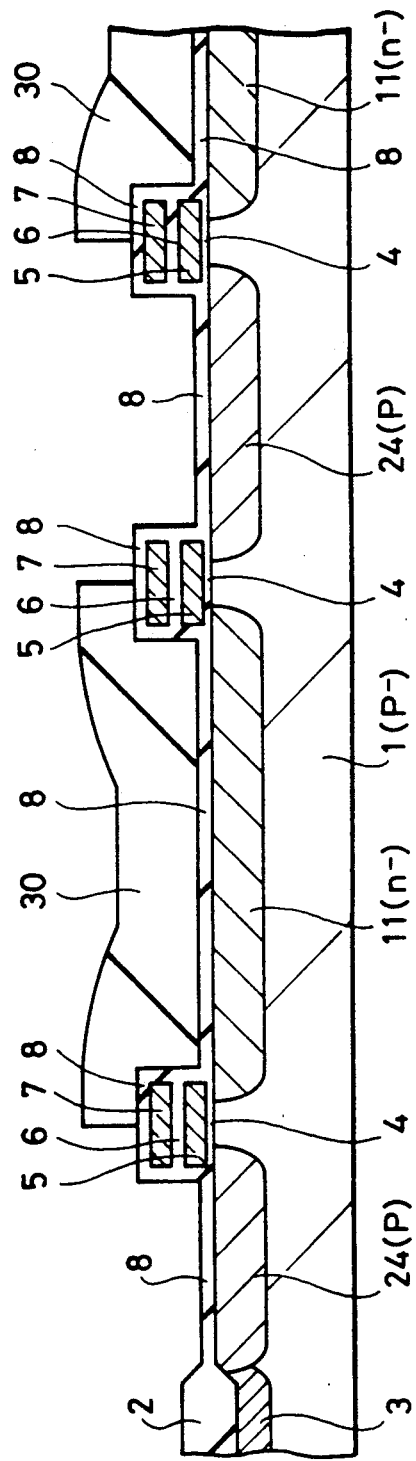

Next, as shown in FIG. 38, the source region of the memory cell and the ground potential line GL are covered with a mask 30 consisting of a resist film. This mask is disposed in such a manner as to cover the peripheral circuit region as a whole. Next, a p type impurity such as boron is introduced in a dose of from 2 to $5 \times 10^{12}$ atoms/cm² by ion implantation into the surface of the semiconductor substrate 1 exposed from the mask 30 and the gate electrodes 5, 7, thereby forming the p type semiconductor region 24. The mask 30 is then removed. Incidentally, the n− type semiconductor region 11 and the p type semiconductor region 24 may be extended by annealing.

Figure 39:
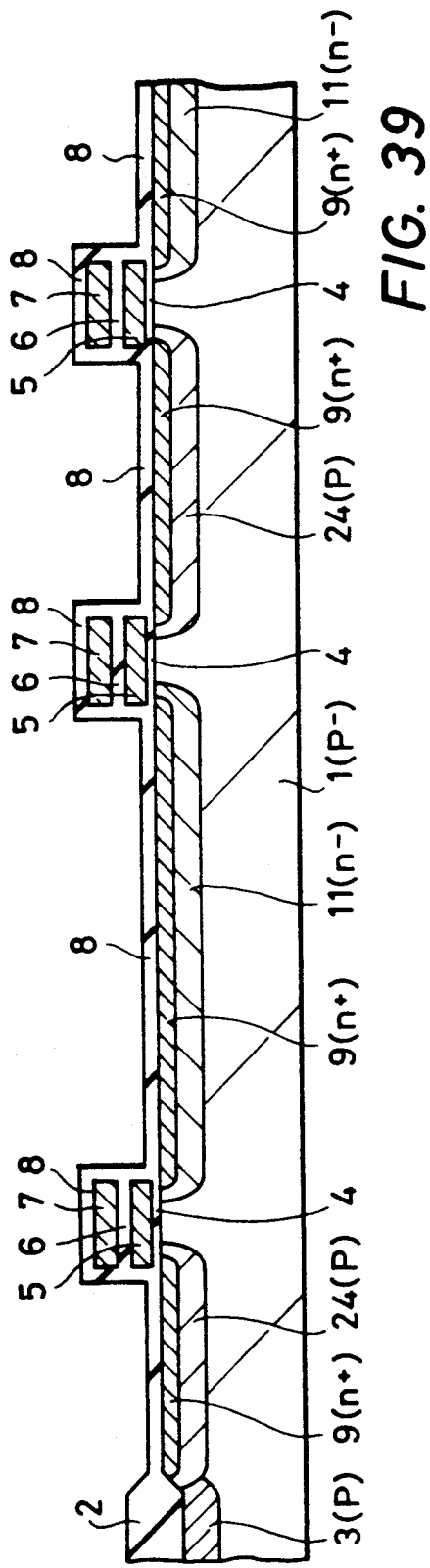

As shown in FIG. 39, an n type impurity such as arsenic is introduced by ion implantation into the surface of the semiconductor substrate 1 using the gate electrodes 5, 7 as the mask in order to form the n+ type semiconductor region 9. In this ion implantation process the peripheral circuit region is covered with a mask consisting of a resist film. Incidentally, ion implantation described above may be divided into two steps. In other words, in the first ion implantation process a n type impurity of a low concentration is introduced into the memory cell region and in the N channel MISFET region of the peripheral circuit and in the second ion implantation process, the whole peripheral circuit region is covered with the mask consisting of the resist film lest the n type impurity is introduced into the peripheral circuit region. In this manner, the n+ type semiconductor region 9 having a shallow unction can be formed in the memory cell region while the n− type semiconductor region having a shallow junction can be formed in the N channel MISFET region of the peripheral circuit.

Figure 40:
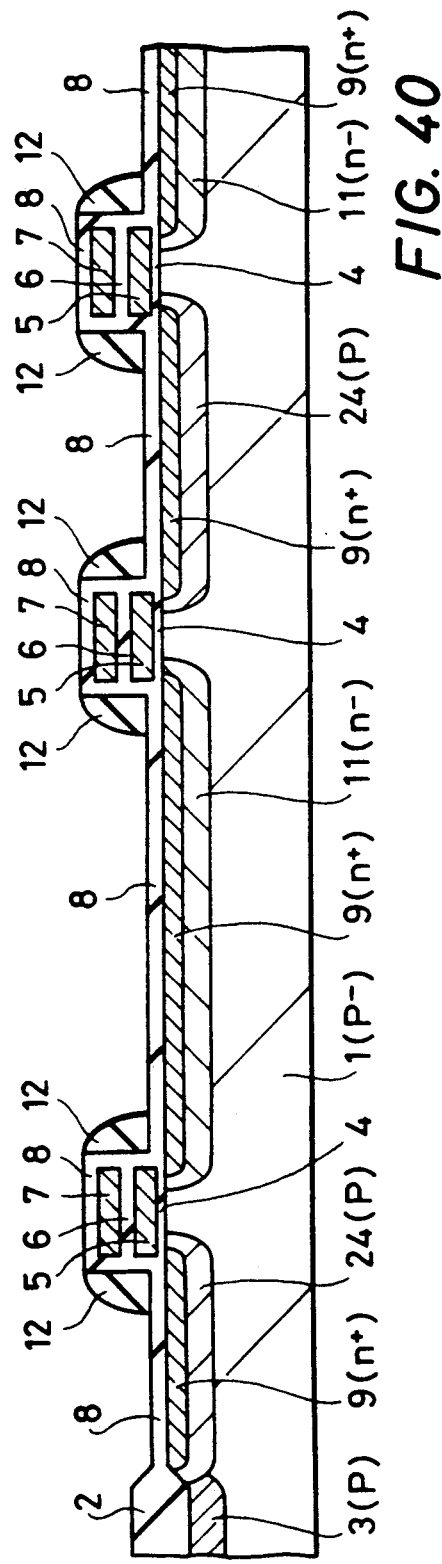

Next, as shown in FIG. 40, the silicon dioxide film formed on the entire surface of the substrate 1 by CVD, for example, is subjected to reactive ion etching (RIE) so as to form a sidewall spacer 12. This sidewall spacer 12 is formed at the side portion of the gate electrode of MISFET'S of the peripheral circuit also.

Then, as shown in FIG. 41, after the P channel MISFET region is covered with a mask consisting of a resist film, an n type impurity such as arsenic is introduced by ion implantation to form an n+ type semiconductor region 10. This region 10 is formed at the portions of the source-drain region of N channel MISFET'S of the peripheral circuit that are spaced apart from the channel region also. The mask of the resist film that has covered the P channel MISFET region is removed after ion implantation. Next, after the memory cell region and the peripheral circuit region are covered with a mask consisting of a resist film, a p type impurity such as boron is introduced into the P channel MISFET region so as to form a p+ type semiconductor region as the source-drain region. The mask of the resist film that has covered the memory cell region and the N channel MISFET region of the peripheral circuit are removed after ion implantation.

As described above, the memory cell and N channel MISFET of the peripheral circuit can be formed by substantially the same production process.

FIG. 42 is a sectional view of the memory cell in accordance with still another embodiment of the present invention.

In this embodiment an n− type semiconductor region 11 is disposed only around an n+ type semiconductor region 9 disposed at the edge of the source region on the channel region side while a p type semiconductor region 24 is disposed only around the n+ type semiconductor region 9 disposed at the edge of the drain region on the channel region side. Since the n− type semiconductor region 11 is disposed at the edge of the source region, the breakdown voltage between the source region and the semiconductor substrate 1 can be improved and the erasing voltage can be improved. Since the n− type semiconductor region 11 has the junction depth substantially equal to that of the n+ type semiconductor region 10 and has small extension into the channel region, fluctuation of the threshold value is small and the electrical characteristics of the memory cell can be improved.

On the other hand, the p type semiconductor region 24 strengthens the electric field applied between the edge of the drain region and the semiconductor substrate 1. Therefore, the generation efficiency of hot carriers as well as the write characteristics can be improved. Since the p type semiconductor region 24 is as shallow as the n+ type semiconductor region 10, its extension into the channel region becomes less. Therefore, fluctuation of the threshold value is small and the electrical characteristics of the memory cell can be improved.

Since the p type semiconductor region 24 does not exist below the n+ type semiconductor region 10, the parasitic capacitance of the drain region becomes small.

The n− type semiconductor region 11 and the p type semiconductor region 24 in this embodiment can be formed in the same way as the n− type semiconductor region 11 shown in FIG. 37 and the p type semiconductor region 24 shown in FIG. 38.

Figure 43:
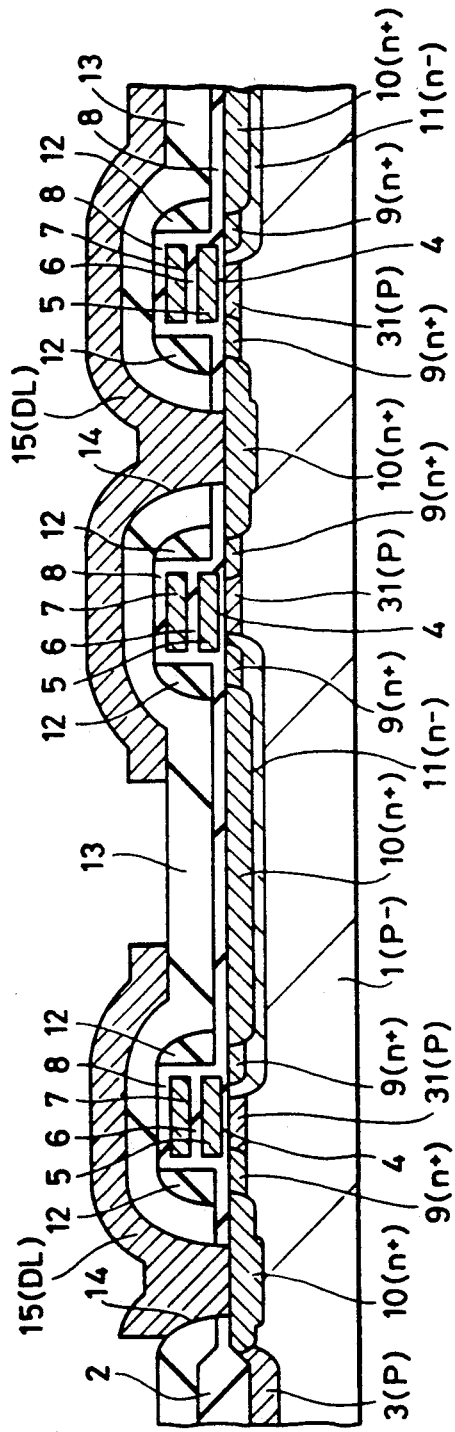

FIG. 43 is a sectional view of the memory cell in accordance with still another embodiment of the present invention.

In this embodiment an n− type semiconductor region 11 having a deep junction extending below an n+ type semiconductor region 10 is disposed in the source region, while a p type semiconductor region 31 is disposed in the channel region. The n− type semiconductor region 11 reaches the channel region. No semiconductor region is disposed below the n+ type semiconductor region 9 that constitutes the edge of the drain region. The n− type semiconductor region 11 improves the breakdown voltage between the source region and the semiconductor substrate 1, while the p type semiconductor region 31 can strengthen the electric field applied to the edge of the drain region.

In order to adjust the threshold value of the memory cell, the p type semiconductor region 31 may employ an ion implantation step which introduces a p type impurity such as boron into the channel region. The dose of ion implantation for forming the p type semiconductor region may be from about 2 to $5 \times 10^{12}$ atoms/cm$^2$. Incidentally, the ion implantation step for adjusting the threshold value of the peripheral circuit may be effected separately from the memory cell.

Figure 44:
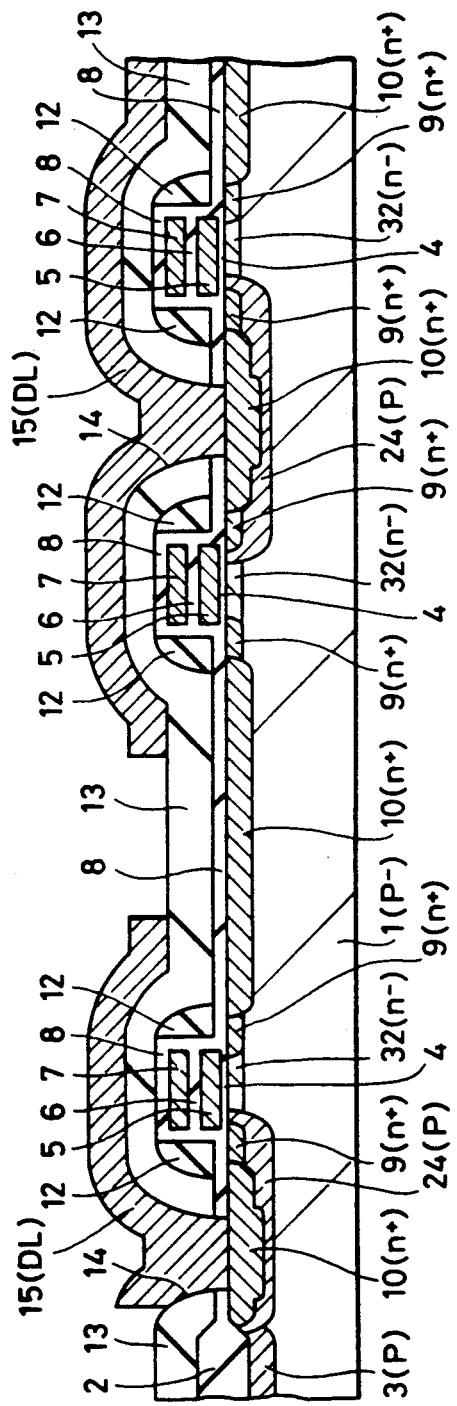

FIG. 44 is a sectional view of the memory cell in accordance with still another embodiment of the present invention.

In this embodiment a p type semiconductor region 24 having a deep junction is disposed in such a manner as to encircle n+ type semiconductor regions 9 and 10 that constitute the drain region, while an n− type semiconductor region 32 is disposed in the channel region. Since the p type semiconductor region 24 is formed in such a manner as to encompass the n+ type semiconductor region 9, extension of the depletion layer at the edge of the drain region can be restricted. Therefore, the generation efficiency of hot carriers at the drain edge can be improved in the write cycle.

On the other hand, since the n− type semiconductor region 32 exists at the end of the source region on the channel side, the electric field can be mitigated. Therefore, the erasing voltage to be applied to the source region in the data erase cycle can be enhanced.

Ion implantation for forming the n− type semiconductor region 32 is made by implanting arsenic, for example, in a dose of $10^{11}$ to $10^{12}$ atoms/cm$^2$.

Incidentally, MISFET $Q_m$ as the memory cell in the embodiments shown in FIG. 36 and 42 to 44 may consist of two transistors $Q_m$ and $Q_T$ in the same way as the memory cell of the embodiment shown in FIGS. 27 to 29.

Although the present invention has thus been described in its some preferred forms, the invention is not particularly limited thereto but can of course be changed or modified in various ways without departing from the spirit and scope thereof.

For instance, 4, 8, 16, . . . data input/output external terminals may be disposed. In such a case, one address signal corresponds to 4, 8, 16 or the like memory cells. The memory cell may be formed inside a p− type well region that is formed inside an n− type semiconductor substrate. The conductivity type of each semiconductor region may be opposite.

Finally, the present invention can be applied widely to electrically writable and erasable ROMs or to non-volatile memories.

What is claimed is:

1. An electrically erasable memory device having a plurality of memory cells; a plurality of word lines; a plurality of data lines; and a plurality of ground potential lines, said plurality of word and data lines are arrayed as a combination of substantially perpendicularly directioned lines wherein each combination of one of said plurality of word lines and one of said plurality of data lines defines a different one of said plurality of memory cells, and further wherein each of said plurality of memory cells comprises a single transistor including:

a control gate coupled to an associated one of said plurality of word lines, a floating gate positioned under said control gate, a first gate insulation film formed between an upper main surface of a semiconductor substrate of a first conductivity type and said floating gate, a second gate insulation film formed between the two gates, a source region coupled to an associated one of said plurality of ground potential lines, and a drain region coupled to an associated one of said plurality of data lines, said source and drain regions being formed in said semiconductor substrate near said upper main surface and on opposite sides of a channel region located beneath said two gates, wherein said drain region includes a first region having a second conductivity type, wherein there is formed in said substrate a second region of said first conductivity type which is adjacent to said drain region, said second region is formed in such a manner so as to be brought into contact with said first region on the channel side thereof and has a higher doping concentration than said channel region and wherein said source region comprises third and fourth regions of said second conductivity type, said fourth region is formed in such a manner so as to surround said third region and has a lower doping concentration than said third region, said memory cell storing data by injecting hot carriers into said floating gate when the associated one of said plurality of word lines and the associated one of said plurality of data lines are set respectively to a first predetermined potential and to a second predetermined potential and erasing said data by emitting said injected carriers from said floating gate to said source region by tunneling through said first gate insulation film when the ground potential line associated therewith is raised in magnitude to a third predetermined potential, and the word line associated therewith is lowered in magnitude to a fourth predetermined potential, wherein said third predetermined potential is of a higher magnitude than said fourth predetermined potential.

2. An electrically erasable memory device according to claim 1, wherein said first and second doping conductivity types are p and n types, respectively.

3. An electrically erasable memory device according to claim 1, wherein said first and second conductivity types are n and p types, respectively.

4. An electrically erasable memory device according to claim 1, wherein said first region comprises a fifth region and a sixth region, said sixth region being formed at a portion of said drain region closer to said channel region than is said fifth region, and wherein said sixth region extends less deeply into said semiconductor substrate than said fifth region.

5. An electrically erasable memory device according to claim 4, wherein said third region comprises a seventh region and an eighth region, said eighth region being formed at a portion of said source region closer to said channel region than is said seventh region, and wherein said eighth region extends less deeply into said semiconductor substrate than said seventh region.

6. An electrically erasable memory device according to claim 5, wherein said second region is formed beneath said sixth region.

7. An electrically erasable memory device according to claim 6, wherein said second region extends into said channel region of the substrate as well as beneath at least said sixth region.

8. An electrically erasable memory device according to claim 7, wherein said fourth region is formed beneath said eighth region.

9. An electrically erasable memory device according to claim 8, wherein said fourth region extends into said channel region of the substrate as well as beneath at least the entire said eighth region.

10. An electrically erasable memory device according to claim 9, wherein said second region is formed to extend beneath both said fifth and sixth regions.

11. An electrically erasable memory device according to claim 10, wherein said fourth region is formed to extend beneath both said seventh and eighth regions.

12. An electrically erasable memory device according to claim 11, wherein said fifth, sixth, seventh and eighth regions are highly doped n-type regions, said second region is a p-type region, said fourth type region is a lightly doped n-type region and wherein said substrate is a lightly doped p-type region.

13. An electrically erasable memory device according to claim 12, wherein said fifth, sixth, seventh and eighth regions have upper surfaces that are planar with respect to the upper main surface of said substrate.

14. An electrically erasable memory device according to claim 4, wherein said second region is formed beneath said sixth region.

15. An electrically erasable memory device according to claim 14, wherein said second region extends into said channel region of the substrate as well as beneath at least said sixth region.

16. An electrically erasable memory device according to claim 15, wherein said second region is formed to extend beneath both said fifth and sixth regions.

17. An electrically erasable memory device according to claim 16, wherein said first and second doping conductivity types are p and n types, respectively.

18. An electrically erasable memory device according to claim 16, wherein said first and second conductivity types are n and p types, respectively.

19. An electrically erasable memory device according to claim 1, wherein said third region comprises a fifth region and a sixth region, said sixth region being formed at a portion of said source region closer to said channel region than said fifth region, and wherein said sixth region extends less deeply into said substrate than said fifth region.

20. An electrically erasable memory device according to claim 19, wherein said fourth region is formed beneath said sixth region.

21. An electrically erasable memory device according to claim 20, wherein said fourth region extends into said channel region of the substrate as well as beneath at least the entire said sixth region.

22. An electrically erasable memory device according to claim 21, wherein said fourth region extends beneath both said fifth and sixth regions.

23. An electrically erasable memory device according to claim 22, wherein said first and second doping conductivity types are p and n types, respectively.

24. An electrically erasable memory device according to claim 22, wherein said first and second conductivity types are n and p types, respectively.

25. An electrically erasable memory device according to claim 1, wherein said first and third regions have upper surfaces that are planar with respect to the upper main surface of said substrate.

26. An electrically erasable memory device having a plurality of memory cells; a plurality of word lines; a plurality of data lines; and a plurality of ground potential lines, said plurality of word and data lines are arrayed as a combination of substantially perpendicularly directioned lines wherein each combination of one of said plurality of word lines and one of said plurality of data lines defines a different one of said plurality of memory cells, and further wherein each of said plurality of memory cells comprises a single transistor including:
 a control gate coupled to an associated one of said plurality of word lines,
 a floating gate positioned under said control gate,
 a first gate insulation film formed between an upper main surface of a semiconductor substrate of a first conductivity type and said floating gate,
 a second gate insulation film formed between the two gates,
 a source region coupled to an associated one of said plurality of ground potential lines, and
 a drain region coupled to an associated one of said plurality of data lines, said source and drain regions being formed in said semiconductor substrate near said upper main surface and on opposite sides of a channel region located beneath said two gates, wherein said drain region includes a first region having a second conductivity type, wherein there is formed in said semiconductor substrate a second region of said first conductivity type which is adjacent to said drain region, said second region is formed in such a manner so as to be brought into contact with said first region on the channel side thereof and has a higher doping concentration than said channel region, wherein said source region comprises third and fourth regions of said second conductivity type, said fourth region is formed in such a manner so as to surround said third region and has a lower doping concentration than said third region, said drain region and said semiconductor substrate exhibiting a lower breakdown voltage therebetween than the breakdown voltage between said source region and said semiconductor substrate, and wherein said memory cell stores data by injecting hot carriers into said floating gate when the associated one of said plurality of word lines and the associated one of said plurality of data lines are set respectively to a first predetermined potential and to a second predetermined potential, and erases said data by emitting said injected carriers from said floating gate to said semiconductor substrate by tunneling through said first gate insulation film when said plurality of ground potential lines are set to a third predetermined potential, which is higher in magnitude than ground potential, and said plurality of word lines are lowered to ground potential.

27. An electrically erasable memory device according to claim 26, wherein said first and second conductivity types are p and n types, respectively.

28. An electrically erasable memory device according to claim 26, wherein said first region comprises fifth and sixth regions, said sixth region being formed at a portion of said drain region adjacent to said channel region, wherein said third region comprises seventh and eighth regions, said eighth region being formed at a portion of said source region adjacent to said channel region; wherein said second region extends into said channel region of the substrate as well as beneath at least said sixth region and said fourth region extends into said channel region of the substrate as well as beneath at least said eighth region thereby respectively surrounding at least said sixth and eighth regions; and wherein said sixth and eighth regions extend less deeply into said semiconductor substrate than do said fifth and seventh regions, respectively.

29. An electrically erasable memory device according to claim 28, wherein said second and fourth regions are formed to extend beneath both said fifth and sixth regions and said seventh and eighth regions, respectively.

30. An electrically erasable memory device according to claim 28, wherein said fourth region extends into said semiconductor substrate to a depth substantially equal to that of said seventh region.

31. An electrically erasable memory device according to claim 30, wherein said second region extends into said semiconductor substrate to a depth substantially equal to that of said fifth region.

32. An electrically erasable memory device according to claim 26, wherein said second predetermined potential is of a magnitude higher than said ground potential and lower than said first predetermined potential.

33. An electrically erasable memory device according to claim 1, wherein said second region is formed in such a manner so as to surround said first region.

34. An electrically erasable memory device according to claim 1, wherein the data line is in a floating state condition in the erasing of data of a memory cell associated therewith.

35. An electrically erasable memory device according to claim 1, wherein the data line is lowered to a ground potential in the erasing of data of a memory cell associated therewith.

36. An electrically erasable memory device according to claim 1, wherein said second predetermined potential is of a level which is lower than and of the same polarity as said first predetermined potential.

37. An electrically erasable memory device according to claim 36, wherein said third predetermined potential is of the same level and polarity as that of said first predetermined potential.

38. An electrically erasable memory device according to claim 26, wherein said first, second and third predetermined potentials are of the same polarity and are of a higher potential than said ground potential.

39. An electrically erasable memory device according to claim 26, wherein said second region is formed in such a manner so as to surround said first region.

40. An electrically erasable memory device according to claim 26, wherein the data line is in a floating state condition in the erasing of data of a memory cell associated therewith.

41. An electrically erasable memory device according to claim 26, wherein the data line is lowered to a ground potential in the erasing of data of a memory cell associated therewith.

42. An electrically erasable memory device according to claim 26, wherein said second predetermined potential is of a level which is lower than and of the same polarity as said first predetermined potential.

43. An electrically erasable memory device according to claim 26, wherein said third predetermined potential is of the same level and polarity as that of said first predetermined potential.

44. An electrically erasable memory device according to claim 37, wherein said second predetermined potential is a higher potential than ground potential, and the ground potential line is lowered to ground potential in the writing of data of a memory cell associated therewith.

45. An electrically erasable memory device according to claim 1, wherein said fourth predetermined potential is ground potential.

46. An electrically erasable memory device according to claim 1, further comprising:
first means, being coupled to the ground potential line, for applying said third predetermined potential to the ground potential line in the erasing of data of a memory cell associated therewith.

47. An electrically erasable memory device according to claim 46, wherein the film thickness of said first gate insulation film is thin enough to permit said tunneling through said first gate insulation film in the erasing of data of a memory cell.

48. An electrically erasable memory device according to claim 47, wherein the film thickness of said first gate insulation film is about 10 nm.

49. An electrically erasable memory device according to claim 39, further comprising:
first means, being coupled to said plurality of ground potential lines, for applying said third predetermine potential to said plurality of ground potential lines in the erasing of data of memory cells.

50. An electrically erasable memory device according to claim 49, wherein the film thickness of said first gate insulation film is thin enough to permit said tunneling through said first gate insulation film in the erasing of data of a memory cell.

51. An electrically erasable memory device according to claim 50, wherein the film thickness of said first gate insulation film is about 10 nm.

52. An electrically erasable memory device according to claim 49, wherein said memory cells are arrayed such that the data thereof is erased altogether when all of said ground potential lines of the arrayed memory cells are raised to the third predetermined potential, and all of said word lines of said arrayed memory cells are lowered to the ground potential.

* * * * *